United States Patent
Adolf et al.

(10) Patent No.: US 11,501,053 B2
(45) Date of Patent: Nov. 15, 2022

(54) TECHNIQUES FOR DETERMINING AND USING STATIC REGIONS IN AN INVERSE DESIGN PROCESS

(71) Applicant: X Development LLC, Mountain View, CA (US)

(72) Inventors: Brian Adolf, San Mateo, CA (US); Patricia Prewitt, Palo Alto, CA (US)

(73) Assignee: X Development LLC, Mountain View, CA (US)

( * ) Notice: Subject to any disclaimer, the term of this patent is extended or adjusted under 35 U.S.C. 154(b) by 174 days.

(21) Appl. No.: 16/994,389

(22) Filed: Aug. 14, 2020

(65) Prior Publication Data

US 2022/0050951 A1  Feb. 17, 2022

(51) Int. Cl.
G06F 30/398  (2020.01)
G06F 30/392  (2020.01)
H04J 14/02  (2006.01)

(52) U.S. Cl.
CPC .......... *G06F 30/398* (2020.01); *G06F 30/392* (2020.01); *H04J 14/02* (2013.01)

(58) Field of Classification Search
CPC ...... G06F 30/398; G06F 30/392; G06F 30/20; H04J 14/02
See application file for complete search history.

(56) References Cited

U.S. PATENT DOCUMENTS

| 10,398,005 | B1 | 8/2019 | Jankovic et al. | |
| 2021/0287078 | A1* | 9/2021 | Liu | G06N 3/0675 |
| 2022/0050951 | A1* | 2/2022 | Adolf | G06F 30/398 |

(Continued)

FOREIGN PATENT DOCUMENTS

| CN | 101834740 A | 9/2010 |
| CN | 111211843 A | 5/2020 |

OTHER PUBLICATIONS

"Inverse design and demonstration of a compact and broadband on-chip wavelength demultiplexer", by Alexander Y. Piggott, Jesse Lu, Konstantinos G. Lagoudakis, Jan Petykiewicz, Thomas M. Babinec, and Jelena Vuckovic, Physic Optics, Apr. 1, 2015.*

(Continued)

*Primary Examiner* — Nha T Nguyen
(74) *Attorney, Agent, or Firm* — Christensen O'Connor Johnson Kindness PLLC

(57) ABSTRACT

In some embodiments, logic stored on a computer-readable medium, in response to execution, causes a computing system to conduct an inverse design process to generate a plurality of segmented designs corresponding to a plurality of device specifications, determine at least one highly impactful design area based on the plurality of segmented designs; and designate the at least one highly impactful design area as a static design area. In some embodiments, a product line comprising a plurality of physical devices is provided. Each physical device of the plurality of physical devices includes a design region that includes a static design area and a customized design area. The static design area for each physical device is the same for each physical device of the plurality of physical devices, and the customized design area for each physical device is different for each physical device of the plurality of physical devices.

19 Claims, 14 Drawing Sheets

(56) References Cited

U.S. PATENT DOCUMENTS

2022/0100921 A1\* 3/2022 Schubert ................ G06F 30/20

OTHER PUBLICATIONS

Su, L. et al., "Nanophotonic Inverse Design with SPINS: Software Architecture and Practical Considerations," arXiv:1910.04829v2 [physics.app-ph] Oct. 31, 2019, pp. 1-26.
Piggott et al., "Inverse Design and Implementation of a Wavelength Demultiplexing Grating Coupler", Scientific Reports, Nov. 27, 2014, 5 pages.
Piggott et al.,"Inverse Design and Demonstration of a Compact and Broadband On-Chip Wavelength Demultiplexer", Nature Photonics, May 11, 2015, 5 pages.
International Search Report and Written Opinion, dated Nov. 16, 2021, in corresponding International patent Application No. PCT/US2021/043411, 10 pages.

\* cited by examiner

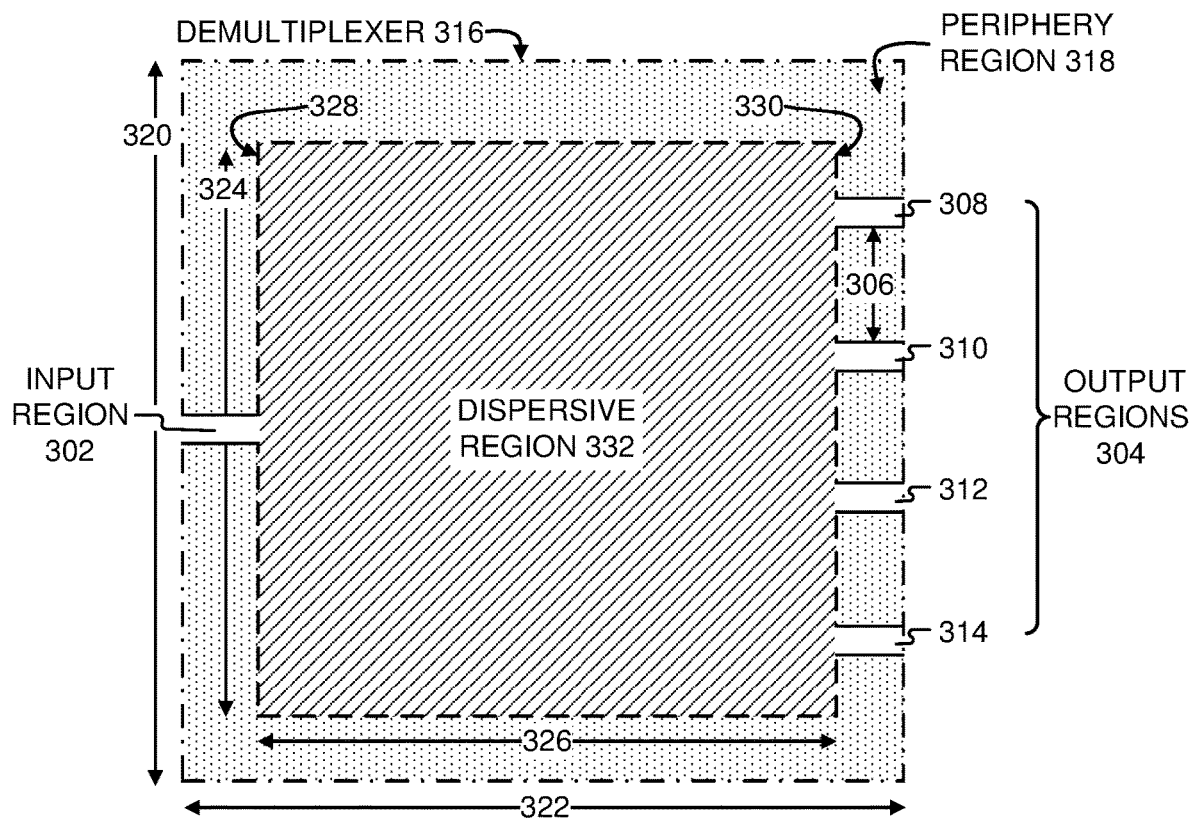
FIG. 3A
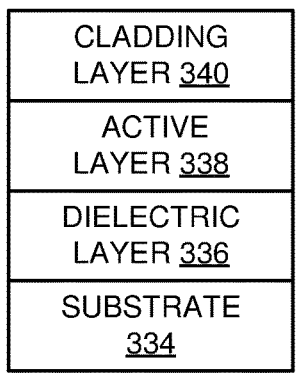
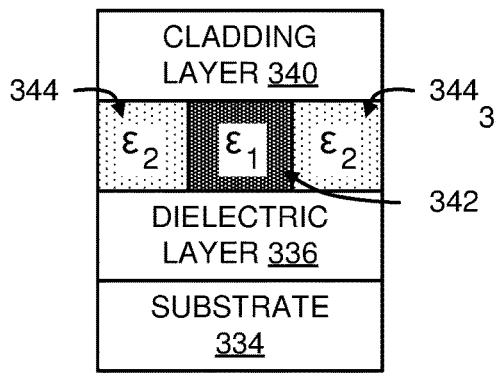
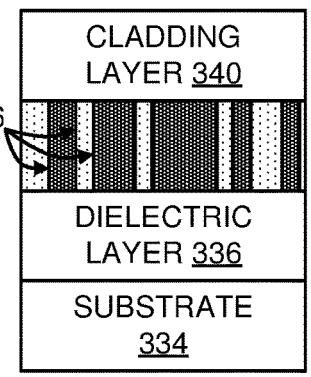
FIG. 3B  FIG. 3C  FIG. 3D

TECHNIQUES FOR DETERMINING AND USING STATIC REGIONS IN AN INVERSE DESIGN PROCESS

TECHNICAL FIELD

This disclosure relates generally to photonic devices, and in particular but not exclusively, relates to optical multiplexers and demultiplexers.

BACKGROUND

Fiber-optic communication is typically employed to transmit information from one place to another via light that has been modulated to carry the information. For example, many telecommunication companies use optical fiber to transmit telephone signals, internet communication, and cable television signals. But the cost of deploying optical fibers for fiber-optic communication may be prohibitive. As such, techniques have been developed to more efficiently use the bandwidth available within a single optical fiber. Wavelength-division multiplexing is one such technique that bundles multiple optical carrier signals onto a single optical fiber using different wavelengths.

BRIEF SUMMARY

In some embodiments, a non-transitory computer-readable medium having logic stored thereon is provided. The logic, in response to execution by one or more processors of a computing system, causes the computing system to perform actions comprising conducting an inverse design process to generate a plurality of segmented designs corresponding to a plurality of device specifications; determining at least one highly impactful design area based on the plurality of segmented designs; and designating the at least one highly impactful design area as a static design area.

In some embodiments, a computer-implemented method for inverse design of a physical device is provided. A device specification is received. A design portion is determined for use in a static design area. An inverse design process is conducted to generate a segmented design corresponding to the device specification, wherein the inverse design process uses the design portion in the static design area.

In some embodiments, a product line comprising a plurality of physical devices is provided. Each physical device of the plurality of physical devices includes a design region. The design region of each physical device includes a static design area and a customized design area. The static design area for each physical device is specified by a segmented design determined by an inverse design process. The segmented design for the static design area is the same for each physical device of the plurality of physical devices. The customized design area for each physical device is specified by a segmented design determined by an inverse design process, and wherein the segmented design for the customized design area is different for each physical device of the plurality of physical devices.

BRIEF DESCRIPTION OF THE SEVERAL VIEWS OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described. To easily identify the discussion of any particular element or act, the most significant digit or digits in a reference number refer to the figure number in which that element is first introduced.

FIG. 3A-FIG. 3D illustrate different views of an example photonic demultiplexer, in accordance with an embodiment of the present disclosure.

DETAILED DESCRIPTION

Figure 1:
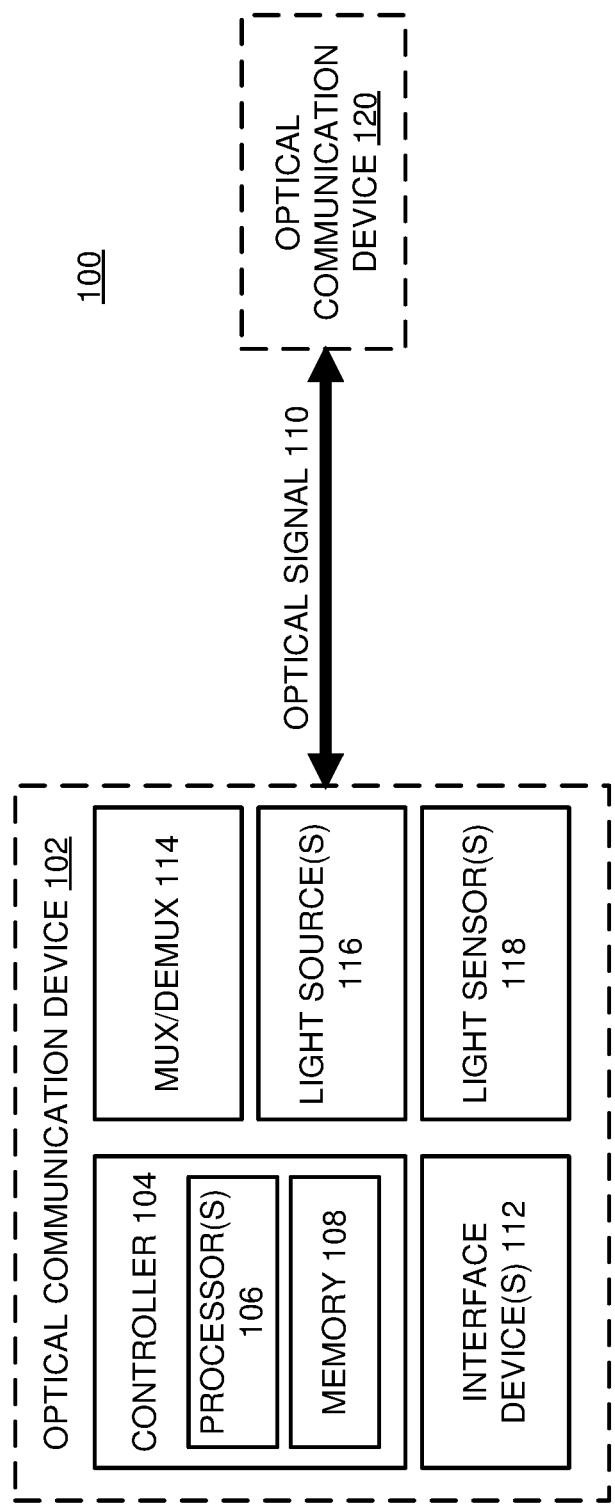
FIG. 1 is a functional block diagram illustrating a system for optical communication between two optical communication devices via an optical signal, in accordance with an embodiment of the present disclosure.

Embodiments of techniques for inverse design of physical devices are described herein, in the context of generating designs for photonic integrated circuits (including a multi-channel photonic demultiplexer). In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Wavelength division multiplexing and its variants (e.g., dense wavelength division multiplexing, coarse wavelength division multiplexing, and the like) take advantage of the bandwidth of optical fibers by bundling multiple optical carrier signals onto a single optical fiber. Once the multiple carrier signals are bundled together, they are transmitted from one place to another over the single optical fiber where they may be demultiplexed to be read out by an optical communication device. However, devices that decouple the carrier signals from one another remain prohibitive in terms of cost, size, and the like.

Moreover, design of photonic devices, such as those used for optical communication, are traditionally designed via conventional techniques sometimes determined through a simple guess and check method or manually-guided grid-search in which a small number of design parameters from pre-determined designs or building blocks are adjusted for suitability to a particular application. However, in actuality, these devices may have design parameters ranging from hundreds all the way to many billions or more, dependent on the device size and functionality. Thus, as functionality of photonic devices increases and manufacturing tolerances improve to allow for smaller device feature sizes, it becomes increasingly important to take full advantage of these improvements via optimized device design.

Described herein are embodiments of a photonic integrated circuit (e.g., a multi-channel photonic demultiplexer and/or multiplexer) having a design obtainable by an inverse design process. More specifically, techniques described in embodiments herein utilize gradient-based optimization in combination with first-principle simulations to generate a design from an understanding of the underlying physics that are expected to govern the operation of the photonic integrated circuit. It is appreciated in other embodiments, design optimization of photonic integrated circuits without gradient-based techniques may also be used. Inverse design may include any technique wherein a performance metric is provided and a design is created to maximize the performance metric. The discussion herein primarily relates to inverse design techniques that use gradient descent with a forward simulation/backpropagation technique to maximize the performance metric. However, the description of these techniques should not be seen as limiting. In some embodiments, other inverse design techniques that can be used to maximize a design's performance based on a performance metric, include, but are not limited to, genetic design, generative design, engineering optimization, shape optimization, and topology optimization.

Advantageously, embodiments and techniques described herein are not limited to conventional techniques used for design of photonic devices, in which a small number of design parameters for pre-determined building blocks are adjusted based on suitability to a particular application. Rather, the first-principles based designs described herein are not necessarily dependent on human intuition and generally may result in designs which outstrip current state-of-the-art designs in performance, size, robustness, or a combination thereof. Further still, rather than being limited to a small number of design parameters due to conventional techniques, the embodiments and techniques described herein may provide scalable optimization of a nearly unlimited number of design parameters. It will also be appreciated that, though the design and fabrication of photonic integrated circuits is described throughout the present text, similar inverse design techniques may be used to generate designs for other types of physical devices.

FIG. 1 is a functional block diagram illustrating a system 100 for optical communication (e.g., via wavelength division multiplexing or other techniques) between optical communication device 102 and optical communication device 120 via optical signal 110, in accordance with various aspects of the present disclosure. More generally, optical communication device 102 is configured to transmit information by modulating light from one or more light sources into a multi-channel optical signal 110 (e.g., a singular optical signal that includes a plurality of distinct wavelength channels) that is subsequently transmitted from optical communication device 102 to optical communication device 120 via an optical fiber, a light guide, a wave guide, or other photonic device. Optical communication device 120 receives the multi-channel optical signal 110 and demultiplexes each of the plurality of distinct wavelength channels from the multi-channel optical signal 110 to extract the transmitted information. It is appreciated that in some embodiments optical communication device 102 and optical communication device 120 may be distinct and separate devices (e.g., an optical transceiver or transmitter communicatively coupled via one or more optical fibers to a separate optical transceiver or receiver). However, in other embodiments, optical communication device 102 and optical communication device 120 may be part of a singular component or device (e.g., a smartphone, a tablet, a computer, optical device, or the like). For example, optical communication device 102 and optical communication device 120 may both be constituent components on a monolithic integrated circuit that are coupled to one another via a waveguide that is embedded within the monolithic integrated circuit and is adapted to carry optical signal 110 between optical communication device 102 and optical communication device 120 or otherwise transmit the optical signal between one place and another.

In the illustrated embodiment, optical communication device 102 includes a controller 104, one or more interface device(s) 112 (e.g., fiber optic couplers, light guides, waveguides, and the like), a multiplexer (mux), demultiplexer (demux), or combination thereof (MUX/DEMUX 114), one or more light source(s) 116 (e.g., light emitting diodes, lasers, and the like), and one or more light sensor(s) 118 (e.g., photodiodes, phototransistors, photoresistors, and the like) coupled to one another. The controller includes one or more processor(s) 106 (e.g., one or more central processing units, application specific circuits, field programmable gate arrays, or otherwise) and memory 108 (e.g., volatile memory such as DRAM and SAM, non-volatile memory such as ROM, flash memory, and the like). It is appreciated that optical communication device 120 may include the same or similar elements as optical communication device 102, which have been omitted for clarity.

Controller 104 orchestrates operation of optical communication device 102 for transmitting and/or receiving optical signal 110 (e.g., a multi-channel optical signal having a plurality of distinct wavelength channels or otherwise).

Controller 104 includes software (e.g., instructions included in memory 108 coupled to processor 106) and/or hardware logic (e.g., application specific integrated circuits, field-programmable gate arrays, and the like) that when executed by controller 104 causes controller 104 and/or optical communication device 102 to perform operations.

In one embodiment, controller 104 may choreograph operations of optical communication device 102 to cause light source(s) 116 to generate a plurality of distinct wavelength channels that are multiplexed via MUX/DEMUX 114 into a multi-channel optical signal 110 that is subsequently transmitted to optical communication device 120 via interface device 112. In other words, light source(s) 116 may output light having different wavelengths (e.g., 1271 nm, 1291 nm, 1311 nm, 1331 nm, 1511 nm, 1531 nm, 1551 nm, 1571, or otherwise) that may be modulated or pulsed via controller 104 to generate a plurality of distinct wavelength channels representative of information. The plurality of distinct wavelength channels are subsequently combined or otherwise multiplexed via MUX/DEMUX 114 into a multi-channel optical signal 110 that is transmitted to optical communication device 120 via interface device 112. In the same or another embodiment, controller 104 may choreograph operations of optical communication device 102 to cause a plurality of distinct wavelength channels to be demultiplexed via MUX/DEMUX 114 from a multi-channel optical signal 110 that is received via interface device 112 from optical communication device 120.

It is appreciated that in some embodiments certain elements of optical communication device 102 and/or optical communication device 120 may have been omitted to avoid obscuring certain aspects of the disclosure. For example, optical communication device 102 and optical communication device 120 may include amplification circuitry, lenses, or components to facilitate transmitting and receiving optical signal 110. It is further appreciated that in some embodiments optical communication device 102 and/or optical communication device 120 may not necessarily include all elements illustrated in FIG. 1. For example, in one embodiment optical communication device 102 and/or optical communication device 120 are passive devices that operate as an intermediary device that may passively multiplex a plurality of distinct wavelength channels into a multi-channel optical signal 110 and/or demultiplex a plurality of distinct wavelength channels from a multi-channel optical signal 110.

Figure 2A:
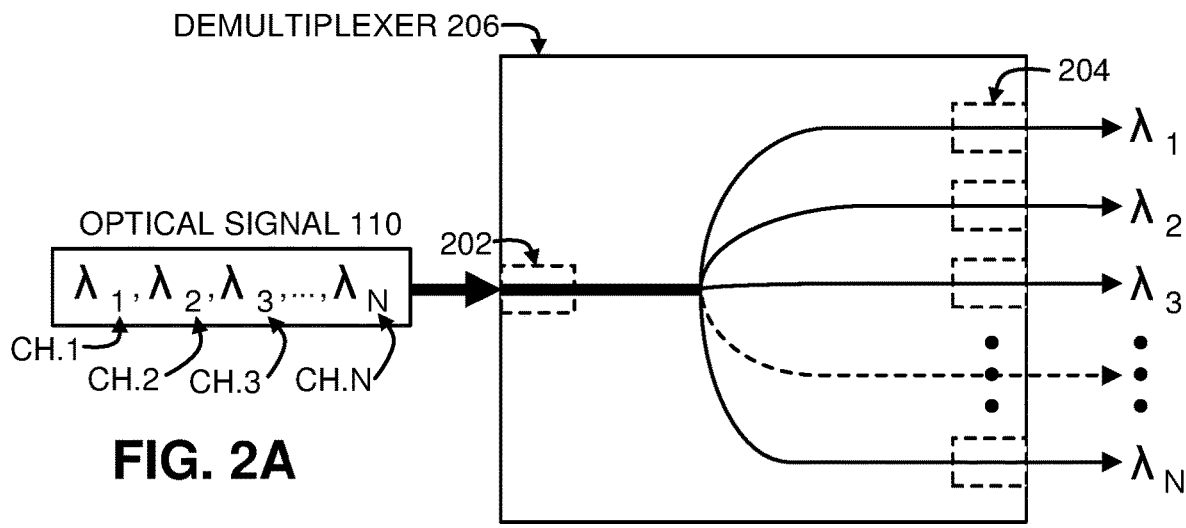
FIG. 2A and FIG. 2B respectively illustrate an example demultiplexer and multiplexer, in accordance with an embodiment of the present disclosure.
Figure 2B:
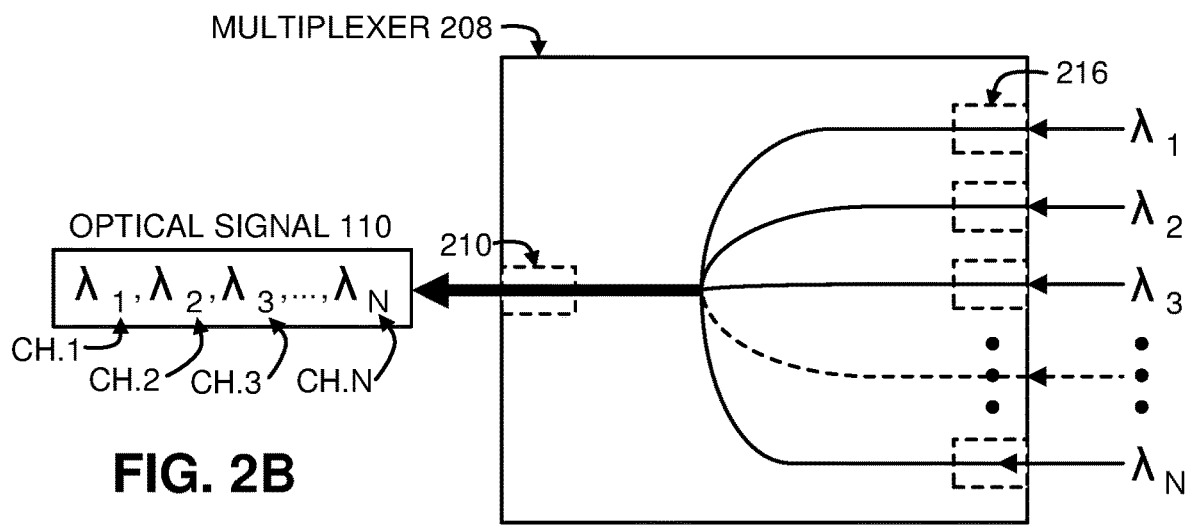

FIG. 2A and FIG. 2B respectively illustrate an example demultiplexer 206 and multiplexer 208, in accordance with various aspects of the present disclosure. Demultiplexer 206 and multiplexer 208 are possible embodiments of MUX/DEMUX 114 illustrated in FIG. 1, and which may be part of an integrated photonic circuit, silicon photonic device, or otherwise As illustrated in FIG. 2A, demultiplexer 206 includes an input region 202 and a plurality of output regions 204. Demultiplexer 206 is configured to receive a multi-channel optical signal 110 that includes a plurality of distinct wavelength channels (e.g., Ch. 1, Ch. 2, Ch. 3, . . . Ch. N, each having a center wavelength respectively corresponding to $\lambda_1, \lambda_2, \lambda_3, \ldots \lambda_N$) via input region 202 (e.g., a waveguide that may correspond to interface device 112 illustrated in FIG. 1) to optically separate each of the plurality of distinct wavelength channels from the multi-channel optical signal 110 and respectively guide each of the plurality of distinct wavelength channels to a corresponding one of a plurality of output regions 204 (e.g., a plurality of waveguides that may correspond to interface device(s) 112 illustrated in FIG. 1). More specifically, in the illustrated embodiment, each of the output regions 204 receives a portion of the multi-channel optical signal that corresponds to, or is otherwise representative of, one of the plurality of distinct wavelength channels that may be output as plurality of optical signals (e.g., $\lambda_1, \lambda_2, \lambda_3, \ldots \lambda_N$). The plurality of output regions 204 may each be coupled to a respective light sensor (e.g., corresponding to light sensor 118 illustrated in FIG. 1), which may be utilized to convert the optical signals demultiplexed from the multi-channel optical signal 110 into electrical signals for further processing.

In the illustrated embodiment of FIG. 2B, multiplexer 208 includes a plurality of input regions 216 and an output region 210. Multiplexer is configured to receive a plurality of distinct optical signals (e.g., $\lambda_1, \lambda_2, \lambda_3, \ldots \lambda_N$), each at a respective one of the plurality of input regions 216 (e.g., a plurality of waveguides that may correspond to interface device(s) 112 illustrated in FIG. 1). Multiplexer 208 is structured or otherwise configured to optically combine (i.e., multiplex) each of the plurality of distinct wavelength channels into a multi-channel optical signal 110 that is guided to output region 210 (e.g., a waveguide that may correspond to interface device 112 illustrated in FIG. 1). It is appreciated that in some embodiments, demultiplexer 206 illustrated in FIG. 2A and multiplexer 208 illustrated in FIG. 2B may be bidirectional such that each device may function as both a demultiplexer and multiplexer.

Figure 2C:
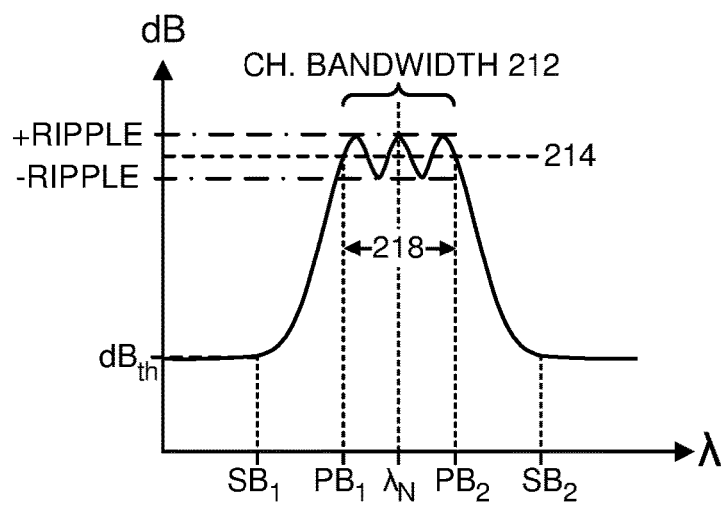
FIG. 2C illustrates an example distinct wavelength channel of a multi-channel optical signal, in accordance with an embodiment of the present disclosure.

FIG. 2C illustrates an example distinct wavelength channel of a multi-channel optical signal (e.g., Ch. N is multi-channel optical signal 110 illustrated in FIG. 1, FIG. 2A, and FIG. 2B), in accordance with various aspects of the present disclosure. The example channel may be representative of an individual channel included in a plurality of distinct wavelength channels of the multi-channel optical signal that may be demultiplexed and/or multiplexed by demultiplexer 206 of FIG. 2A and/or multiplexer 208 of FIG. 2B. Each of the distinct wavelength channels may have different center wavelengths ($\lambda_N$) including at least one of 1271 nm, 1291 nm, 1311 nm, 1331 nm, 1511 nm, 1531 nm, 1551 nm, or 1571 nm, or otherwise. In the illustrated embodiment of FIG. 2C, the distinct wavelength channel has a channel bandwidth 212 of approximately 13 nm wide. However, in other embodiments the channel bandwidth may be different than 13 nm wide. Rather, the channel bandwidth may be considered a configurable parameter that is dependent upon the structure of MUX/DEMUX 114 of FIG. 1, demultiplexer 206 of FIG. 2A, and/or multiplexer 208 of FIG. 2B. For example, in some embodiments each of the plurality of distinct wavelength channels may share a common bandwidth that may correspond to 13 nm or otherwise. Referring back to FIG. 2C, the channel bandwidth 212 may be defined as the width of a passband region 218 (i.e., the region defined as being between $PB_1$ and $PB_2$). The passband region 218 may represent an approximate power transmission of a demultiplexer or multiplexer. It is appreciated that in some embodiments the passband region 218 may include ripple as illustrated in FIG. 2C, which corresponds to fluctuations within the passband region 218. In one or more embodiments, the ripple within the passband region around a central value 214 may be +/−2 dB or less, +/−1 dB or less, +/−0.5 dB or less, or otherwise. In some embodiments, the channel bandwidth 212 may be defined by the passband region 218. In other embodiments, the channel bandwidth 212 may be defined as the measured power above a threshold (e.g., $dB_{th}$). For example, demultiplexer 206 illustrated in FIG. 2A may optically separate channel N from multi-channel optical signal 110 and have a corresponding channel bandwidth for channel N equivalent to the range of wavelengths above a threshold value that are transmitted to the output region 204 mapped to channel N (i.e., $\lambda_N$). In the same or other embodiments, isolation of the channel (i.e., defined by channel bandwidth 212) may also be considered when optimizing the design. The isolation may be defined as a ratio between the passband region 218 and the stopband regions (e.g., regions less than $SB_1$ and greater than $SB_2$). It is further appreciated that transition band regions (e.g., a first transition region between $SB_1$ and $PB_1$ and a second transition region between $PB_2$ and $SB_2$) are exemplary and may be exaggerated for the purposes of illustration. In some embodiments, optimization of the design of the photonic demultiplexer may also include a target metric for a slope, width, or the like of the transition band regions.

FIG. 3A-FIG. 3D illustrate different views of an example photonic demultiplexer, in accordance with an embodiment of the present disclosure. Photonic demultiplexer 316 is one possible implementation of MUX/DEMUX 114 illustrated in FIG. 1 and demultiplexer 206 illustrated in FIG. 2A. It is further appreciated that while discussion henceforth may be directed towards photonic integrated circuits capable of demultiplexing a plurality of distinct wavelength channels from a multi-channel optical signal, that in other embodiments, a demultiplexer (e.g., demultiplexer 316) may also or alternatively be capable of multiplexing a plurality of distinct wavelength channels into a multi-channel optical signal, in accordance with embodiments of the present disclosure.

FIG. 3A illustrates a cross-sectional view of demultiplexer 316 along a lateral plane within an active layer defined by a width 320 and a length 322 of the demultiplexer 316. As illustrated, demultiplexer 316 includes an input region 302 (e.g., comparable to input region 202 illustrated in FIG. 2A), a plurality of output regions 304 (e.g., comparable to plurality of output regions 204 illustrated in FIG. 2A), and a dispersive region optically disposed between the input region 302 and plurality of output regions 304. The input region 302 and plurality of output regions 304 (e.g., output region 308, output region 310, output region 312, and output region 314) may each be waveguides (e.g., slab waveguide, strip waveguide, slot waveguide, or the like) capable of propagating light along the path of the waveguide. The dispersive region 332 includes a first material and a second material (see, e.g., FIG. 3D) inhomogeneously interspersed to form a plurality of interfaces that each correspond to a change in refractive index of the dispersive region 332 and collectively structure the dispersive region 332 to optically separate each of a plurality of distinct wavelength channels (e.g., Ch. 1, Ch. 2, Ch. 3, . . . Ch. N illustrated in FIG. 2A) from a multi-channel optical signal (e.g., optical signal 110 illustrated in FIG. 2A) and respectively guide each of the plurality of distinct wavelength channels to a corresponding one of the plurality of output regions 304 when the input region 302 receives the multi-channel optical signal. In other words, input region 302 is adapted to receive the multi-channel optical signal including a plurality of distinct wavelength channels and the plurality of output regions 304 are adapted to each receive a corresponding one of the plurality of distinct wavelength channels demultiplexed from the multi-channel optical signal via dispersive region 332.

Figure 4A:
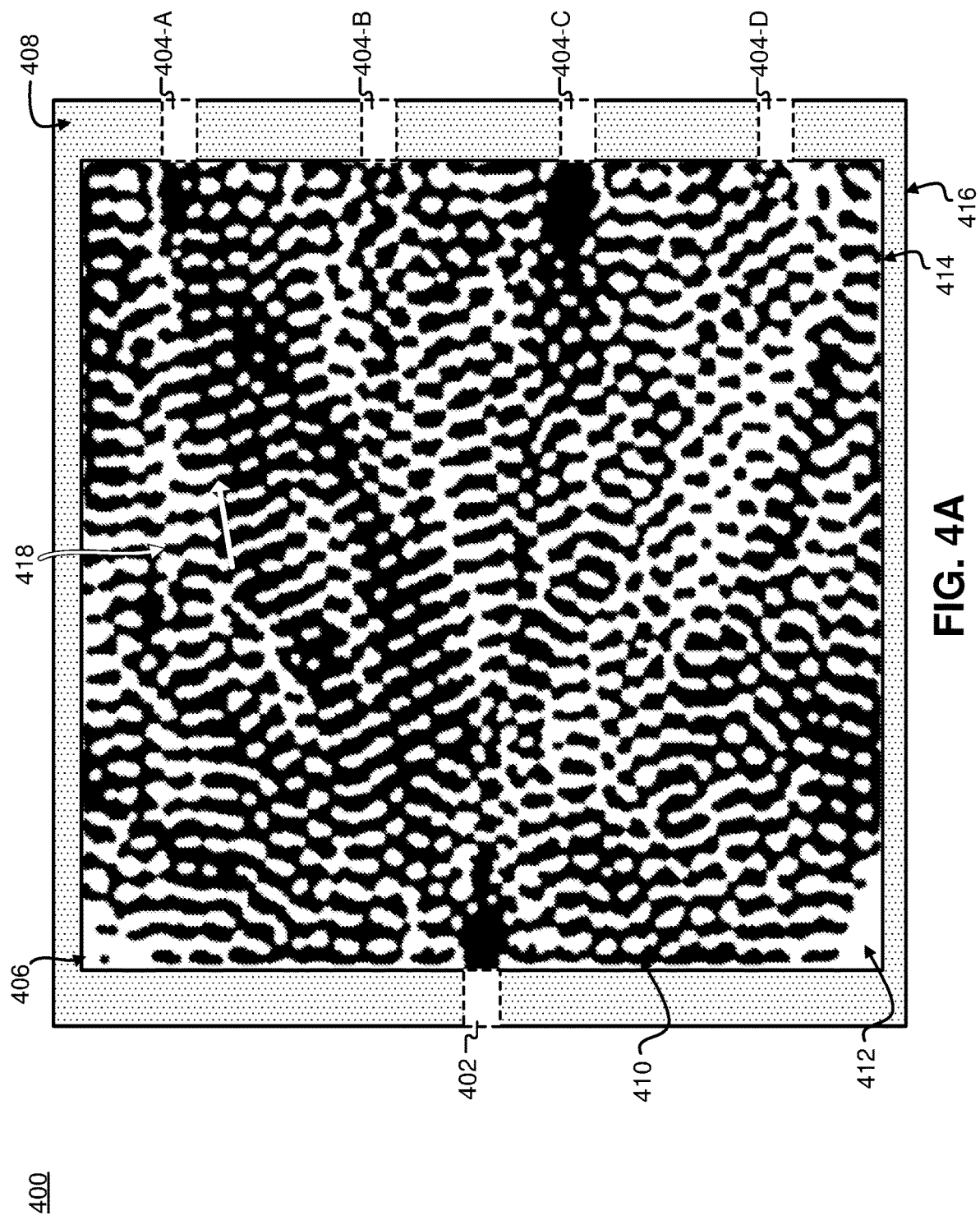
FIG. 4A and FIG. 4B illustrate a more detailed cross-sectional view of a dispersive region of an example photonic demultiplexer, in accordance with an embodiment of the present disclosure.
Figure 4B:
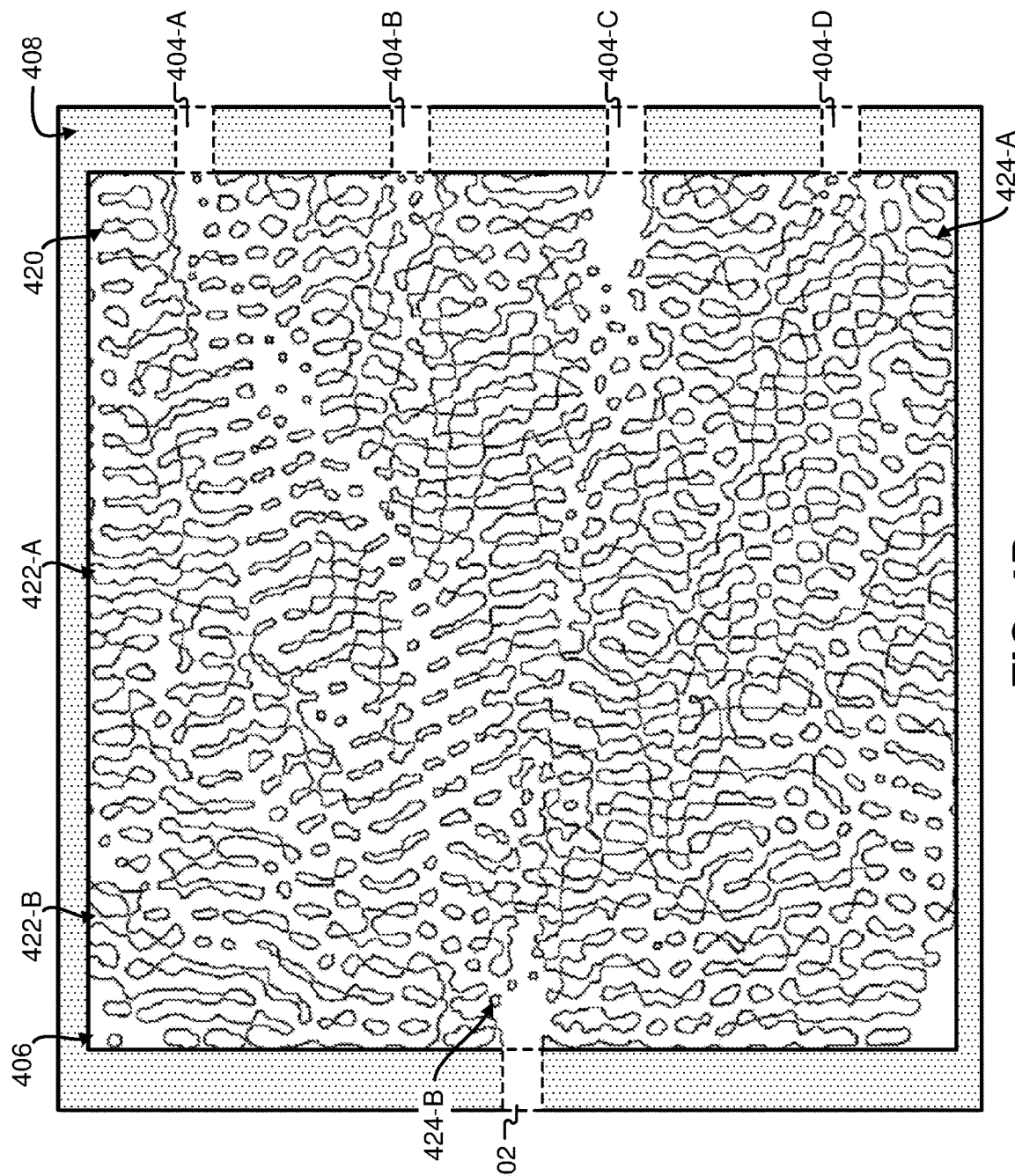

As illustrated in FIG. 3A, and more clearly shown in FIG. 3D and FIG. 4A-B, the shape and arrangement of the first and second material that are inhomogeneously interspersed create a plurality of interfaces that collectively form a material interface pattern along a cross-sectional area of dispersive region 332 that is at least partially surrounded by a periphery boundary region 318 that includes the second material. In some embodiments periphery region 318 has a substantially homogeneous composition that includes the second material. In the illustrated embodiment, dispersive region 332 includes a first side 328 and a second side 330 that each interface with an inner boundary (i.e., the unlabeled dashed line of periphery region 318 disposed between dispersive region 332 and dashed-dotted line corresponding to an outer boundary of periphery region 318). First side 328 and second side 330 are disposed correspond to opposing sides of dispersive region 332. Input region 302 is disposed proximate to first side 328 (e.g., one side of input region 302 abuts first side 328 of dispersive region 332) while each of the plurality of output regions 304 are disposed proximate to second side 330 (e.g., one side of each of the plurality of output regions 304 abuts second side 330 of dispersive region 332).

In the illustrated embodiment each of the plurality of output regions 304 are parallel to each other one of the plurality of output regions 304. However, in other embodiments the plurality of output regions 304 may not be parallel to one another or even disposed on the same side (e.g., one or more of the plurality of output regions 304 and/or input region 302 may be disposed proximate to sides of dispersive region 332 that are adjacent to first side 328 and/or second side 330). In some embodiments adjacent ones of the plurality of output regions are separated from each other by a common separation distance when the plurality of output regions includes at least three output regions. For example, as illustrated adjacent output region 308 and output region 310 are separated from one another by distance 306, which may be common to the separation distance between other pairs of adjacent output regions.

As illustrated in the embodiment of FIG. 3A, demultiplexer 316 includes four output regions 304 (e.g., output region 308, output region 310, output region 312, output region 314) that are each respectively mapped (i.e., by virtue of the structure of dispersive region 332) to a respective one of four channels included in a plurality of distinct wavelength channels. More specifically, the plurality of interfaces of dispersive region 332, defined by the inhomogeneous interspersion of a first material and a second material, form a material interface pattern along a cross-sectional area of the dispersive region 332 (e.g., as illustrated in FIG. 3A, FIG. 4A, or FIG. 4B) to cause the dispersive region 332 to optically separate each of the four channels from the multi-channel optical signal and route each of the four channels to a respective one of the four output regions 304 when the input region 302 regions the multi-channel optical signal.

It is noted that the first material and second material of dispersive region 332 are arranged and shaped within the dispersive region such that the material interface pattern is substantially proportional to a design obtainable with an inverse design process, which will be discussed in greater detail later in the present disclosure. More specifically, in some embodiments, the inverse design process may include iterative gradient-based optimization of a design based at least in part on a loss function that incorporates a performance loss (e.g., to enforce functionality) and a fabrication loss (e.g., to enforce fabricability and binarization of a first material and a second material) that is reduced or otherwise adjusted via iterative gradient-based optimization to generate the design. In the same or other embodiments, other optimization techniques may be used instead of, or jointly with, gradient-based optimization. Advantageously, this allows for optimization of a near unlimited number of design parameters to achieve functionality and performance within a predetermined area that may not have been possible with conventional design techniques.

For example, in one embodiment dispersive region 332 is structured to optically separate each of the four channels from the multi-channel optical signal within a predetermined area of 35 µm×35 µm (e.g., as defined by width 324 and length 326 of dispersive region 332) when the input region 302 receives the multi-channel optical signal. In the same or another embodiment, the dispersive region is structured to accommodate a common bandwidth for each of the four channels, each of the four channels having different center wavelengths. In one embodiment the common bandwidth is approximately 13 nm wide and the different center wavelengths is selected from a group consisting of 1271 nm, 1291 nm, 1311 nm, 1331 nm, 1511 nm, 1531 nm, 1551 nm, and 1571 nm. In some embodiments, the entire structure of demultiplexer 316 (e.g., including input region 302, periphery region 318, dispersive region 332, and plurality of output regions 304) fits within a predetermined area (e.g., as defined by width 320 and length 322). In one embodiment the predetermined area is 35 µm×35 µm. It is appreciated that in other embodiments dispersive region 332 and/or demultiplexer 316 fits within other areas greater than or less than 35 µm×35 µm, which may result in changes to the structure of dispersive region 332 (e.g., the arrangement and shape of the first and second material) and/or other components of demultiplexer 316.

In the same or other embodiments the dispersive region is structured to have a power transmission of −2 dB or greater from the input region 302, through the dispersive region 332, and to the corresponding one of the plurality of output regions 304 for a given wavelength within one of the plurality of distinct wavelength channels. For example, if channel 1 of a multi-channel optical signal is mapped to output region 308, then when demultiplexer 316 receives the multi-channel optical signal at input region 302 the dispersive region 332 will optically separate channel 1 from the multi-channel optical signal and guide a portion of the multi-channel optical signal corresponding to channel 1 to output region 308 with a power transmission of −2 dB or greater. In the same or another embodiment, dispersive region 332 is structured such that an adverse power transmission (i.e., isolation) for the given wavelength from the input region to any of the plurality of output regions other than the corresponding one of the plurality of output regions is −30 dB or less, −22 dB or less, or otherwise. For example, if channel 1 of a multi-channel optical signal is mapped to output region 308, then the adverse power transmission from input region 302 to any other one of the plurality of output regions (e.g., output region 310, output region 312, output region 314) other than the corresponding one of the plurality of output regions (e.g., output region 308) is −30 dB or less, −22 dB or less, or otherwise. In some embodiments, a maximum power reflection from demultiplexer 316 of an input signal (e.g., a multi-channel optical signal) received at an input region (e.g., input region 302) is reflected back to the input region by dispersive region 332 or otherwise is −40 dB or less, −20 dB or less, −8 dB or less, or otherwise. It is appreciated that in other embodiments the power transmission, adverse power transmission, maximum power, or other performance characteristics may be different than the respective values discussed herein, but the structure of dispersive region 332 may change due to the intrinsic relationship between structure, functionality, and performance of demultiplexer 316.

FIG. 3B illustrates a vertical schematic or stack of various layers that are included in the illustrated embodiment of demultiplexer 316. However, it is appreciated that the illustrated embodiment is not exhaustive and that certain features or elements may be omitted to avoid obscuring certain aspects of the invention. In the illustrated embodiment, demultiplexer 316 includes substrate 334, dielectric layer 336, active layer 338 (e.g., as shown in the cross-sectional illustration of FIG. 3A), and a cladding layer 340. In some embodiments, demultiplexer 316 may be, in part or otherwise, a photonic integrated circuit or silicon photonic device that is compatible with conventional fabrication techniques (e.g., lithographic techniques such as photolithographic, electron-beam lithography and the like, sputtering, thermal evaporation, physical and chemical vapor deposition, and the like).

In one embodiment a silicon on insulator (SOI) wafer may be initially provided that includes a support substrate (e.g., a silicon substrate) that corresponds to substrate 334, a silicon dioxide dielectric layer that corresponds to dielectric layer 336, a silicon layer (e.g., intrinsic, doped, or otherwise), and a oxide layer (e.g., intrinsic, grown, or otherwise). In one embodiment, the silicon in the active layer 338 may be etched selectively by lithographically creating a pattern on the SOI wafer that is transferred to SOI wafer via a dry etch process (e.g., via a photoresist mask or other hard mask) to remove portions of the silicon. The silicon may be etched all the way down to dielectric layer 336 to form voids that may subsequently be backfilled with silicon dioxide that is subsequently encapsulated with silicon dioxide to form cladding layer 340. In one embodiment, there may be several etch depths including a full etch depth of the silicon to obtain the targeted structure. In one embodiment, the silicon may be 206 nm thick and thus the full etch depth may be 206 nm. In some embodiments, this may be a two-step encapsulation process in which two silicon dioxide depositions are performed with an intermediate chemical mechanical planarization used to yield a planar surface.

FIG. 3C illustrates a more detailed view of active layer 338 (relative to FIG. 3B) taken along a portion of periphery region 318 that includes input region 302 of FIG. 3A. In the illustrated embodiment, active layer 338 includes a first material 342 with a refractive index of $\varepsilon_1$ and a second material 344 with a refractive index of $\varepsilon_2$ that is different from $\varepsilon_1$. Homogenous regions of the first material 342 and the second material 344 may form waveguides or portions of waveguides that correspond to input region 302 and plurality of output regions 304 as illustrated in FIG. 3A and FIG. 3C.

FIG. 3D illustrates a more detailed view of active layer 338 (relative to FIG. 3B) taken along dispersive region 332. As described previously, active layer 338 includes a first material 342 (e.g., silicon) and a second material 344 (e.g., silicon dioxide) that are inhomogeneously interspersed to form a plurality of interfaces 346 that collectively form a material interface pattern. Each of the plurality of interfaces 346 that form the interface pattern correspond to a change in refractive index of dispersive region 332 to structure the dispersive region (i.e., the shape and arrangement of first material 342 and second material 344) to provide, at least in part, the functionality of demultiplexer 316 (i.e., optical separation of the plurality of distinct wavelength channels from the multi-channel optical signal and respective guidance of each of the plurality of distinct wavelength channels to the corresponding one of the plurality of output regions 304 when the input region 302 receives the multi-channel optical signal).

It is appreciated that in the illustrated embodiments of demultiplexer 316 as shown in FIG. 3A-D, the change in refractive index is shown as being vertically consistent (i.e., the first material 342 and second material 344 form interfaces that are substantially vertical or perpendicular to a lateral plane or cross-section of demultiplexer 316. However, in the same or other embodiments, the plurality of interfaces (e.g., interfaces 346 illustrated in FIG. 3D) may not be substantially perpendicular with the lateral plane or cross-section of demultiplexer 316.

FIG. 4A illustrates a more detailed cross-sectional view of a dispersive region of example photonic demultiplexer 400, in accordance with an embodiment of the present disclosure. FIG. 4B illustrates a more detailed view of an interface pattern formed by the shape and arrangement of a first material 410 and a second material 412 for the dispersive region of the photonic demultiplexer 400 of FIG. 4A. Photonic demultiplexer 400 is one possible implementation of MUX/DEMUX 114 illustrated in FIG. 1, demultiplexer 206 illustrated in FIG. 2A, and demultiplexer 316 illustrated in FIG. 3A-D.

As illustrated in FIG. 4A and FIG. 4B, photonic demultiplexer 400 includes an input region 402, a plurality of output regions 404, and a dispersive region 406 optically disposed between input region 402 and plurality of output regions 404. Dispersive region 406 is surrounded, at least in part, by a peripheral region 408 that includes an inner boundary 414 and an outer boundary 416. It is appreciated that like named or labeled elements of photonic demultiplexer 400 may similarly correspond to like named or labeled elements of other demultiplexers described in embodiments of the present disclosure.

The first material 410 (i.e., black colored regions within dispersive region 406) and second material 412 (i.e., white colored regions within dispersive region 406) of photonic demultiplexer 400 are inhomogeneously interspersed to create a plurality of interfaces that collectively form material interface pattern 420 as illustrated in FIG. 4B. More specifically, an inverse design process that utilizes iterative gradient-based optimization, Markov Chain Monte Carlo optimization, or other optimization techniques combined with first principles simulations to generate a design that is substantially replicated by dispersive region 406 within a proportional or scaled manner such that photonic demultiplexer 400 provides the desired functionality. In the illustrated embodiment, dispersive region 406 is structured to optically separate each of a plurality of distinct wavelength channels from a multi-channel optical signal and respectively guide each of the plurality of distinct wavelength channels to a corresponding one of the plurality of output regions 404 when the input region 402 receives the multi-channel optical signal. More specifically, the plurality of output regions 404-A, -B, -C, and -D are respectively mapped to wavelength channels having center wavelengths corresponding to 1271 nm, 1291 nm, 1311 nm, and 1331 nm. In another embodiment, output regions 404-A, 404-B, 404-C, and 404-D are respectively mapped to wavelength channels having center wavelengths that correspond to 1511 nm, 1531 nm, 1551 nm, and 1571 nm.

As illustrated in FIG. 4B, material interface pattern 420, which is defined by the black lines within dispersive region 406 and corresponds to a change in refractive index within dispersive region 406, includes a plurality of protrusions 422. A first protrusion 422-A is formed of the first material 410 and extends from peripheral region 408 into dispersive region 406. Similarly, a second protrusion 422-B is formed of the second material 412 and extends from peripheral region 408 into dispersive region 406. Further illustrated in FIG. 4B, dispersive region 406 includes a plurality of islands 424 formed of either the first material 410 or the second material 412. The plurality of islands 424 include a first island 424-A that is formed of the first material 410 and is surrounded by the second material 412. The plurality of islands 424 also includes a second island 424-B that is formed of the second material 412 and is surrounded by the first material 412.

In some embodiments, material interface pattern 420 includes one or more dendritic shapes, wherein each of the one or more dendritic shapes are defined as a branched structure formed from first material 410 or second material 412 and having a width that alternates between increasing and decreasing in size along a corresponding direction. Referring back to FIG. 4A, for clarity, dendritic structure 418 is labeled with a white arrow having a black border. As can be seen, the width of dendritic structure 418 alternatively increases and decreases in size along a corresponding direction (i.e., the white labeled arrow overlaying a length of dendritic structure 418) to create a branched structure. It is appreciated that in other embodiments there may be no protrusions, there may be no islands, there may be no dendritic structures, or there may be any number, including zero, of protrusions, islands of any material included in the dispersive region 406, dendritic structures, or a combination thereof.

In some embodiments, the inverse design process includes a fabrication loss that enforces a minimum feature size, for example, to ensure fabricability of the design. In the illustrated embodiment of photonic demultiplexer 400 illustrated in FIG. 4A and FIG. 4B, material interface pattern 420 is shaped to enforce a minimum feature size within dispersive region 406 such that the plurality of interfaces within the cross-sectional area formed with first material 410 and second material 412 do not have a radius of curvature with a magnitude of less than a threshold size. For example, if the minimum feature size is 150 nm, the radius of curvature for any of the plurality of interfaces have a magnitude of less than the threshold size, which corresponds the inverse of half the minimum feature size (i.e., $\frac{1}{75}$ nm$^{-1}$). Enforcement of such a minimum feature size prevents the inverse design process from generating designs that are not fabricable by considering manufacturing constraints, limitations, and/or yield. In the same or other embodiments, different or additional checks on metrics related to fabricability may be utilized to enforce a minimum width or spacing as a minimum feature size.

Figure 5:
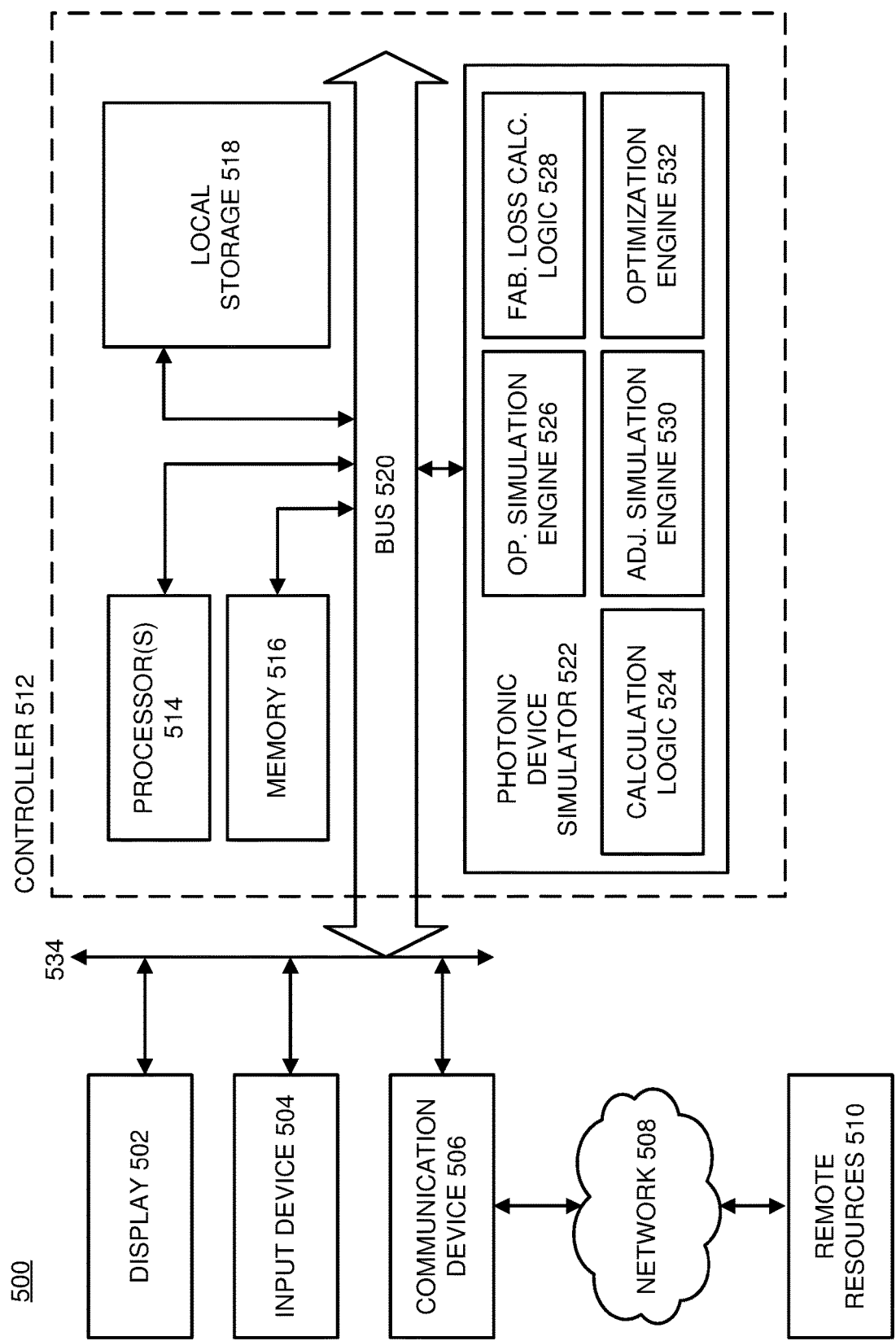
FIG. 5 is a functional block diagram illustrating a system for generating a design of a photonic integrated circuit, in accordance with an embodiment of the present disclosure.

FIG. 5 is a functional block diagram illustrating a system 500 for generating a design of a photonic integrated circuit (i.e., photonic device), in accordance with an embodiment of the disclosure. System 500 may be utilized to perform an inverse design process that generates a design with iterative gradient-based optimization that takes into consideration the underlying physics that govern the operation of the photonic integrated circuit. More specifically, system 500 is a design tool that may be utilized to optimize structural parameters (e.g., shape and arrangement of a first material and a second material within the dispersive region of the embodiments described in the present disclosure) of photonic integrated circuits based on first-principles simulations (e.g., electromagnetic simulations to determine a field response of the photonic device to an excitation source) and iterative gradient-based optimization. In other words, system 500 may provide a design obtained via the inverse design process that is substantially replicated (i.e., proportionally scaled) by dispersive region 332 and dispersive region 406 of demultiplexer 316 and photonic demultiplexer 400 illustrated in FIG. 3A and FIG. 4A, respectively.

As illustrated, system 500 includes controller 512, display 502, input device(s) 504, communication device(s) 506, network 508, remote resources 510, bus 534, and bus 520. Controller 512 includes processor 514, memory 516, local storage 518, and photonic device simulator 522. Photonic device simulator 522 includes operational simulation engine 526, fabrication loss calculation logic 528, calculation logic 524, adjoint simulation engine 530, and optimization engine 532. It is appreciated that in some embodiments, controller 512 may be a distributed system.

Controller 512 is coupled to display 502 (e.g., a light emitting diode display, a liquid crystal display, and the like) coupled to bus 534 through bus 520 for displaying information to a user utilizing system 500 to optimize structural parameters of the photonic device (i.e., demultiplexer). Input device 504 is coupled to bus 534 through bus 520 for communicating information and command selections to processor 514. Input device 504 may include a mouse, trackball, keyboard, stylus, or other computer peripheral, to facilitate an interaction between the user and controller 512. In response, controller 512 may provide verification of the interaction through display 502.

Another device, which may optionally be coupled to controller 512, is a communication device 506 for accessing remote resources 510 of a distributed system via network 508. Communication device 506 may include any of a number of networking peripheral devices such as those used for coupling to an Ethernet, Internet, or wide area network, and the like. Communication device 506 may further include a mechanism that provides connectivity between controller 512 and the outside world. Note that any or all of the components of system 500 illustrated in FIG. 5 and associated hardware may be used in various embodiments of the present disclosure. The remote resources 510 may be part of a distributed system and include any number of processors, memory, and other resources for optimizing the structural parameters of the photonic device.

Controller 512 orchestrates operation of system 500 for optimizing structural parameters of the photonic device. Processor 514 (e.g., one or more central processing units, graphics processing units, and/or tensor processing units, etc.), memory 516 (e.g., volatile memory such as DRAM and SRAM, non-volatile memory such as ROM, flash memory, and the like), local storage 518 (e.g., magnetic memory such as computer disk drives), and the photonic device simulator 522 are coupled to each other through bus 520. Controller 512 includes software (e.g., instructions included in memory 516 coupled to processor 514) and/or hardware logic (e.g., application specific integrated circuits, field-programmable gate arrays, and the like) that when executed by controller 512 causes controller 512 or system 500 to perform operations. The operations may be based on instructions stored within any one of, or a combination of, memory 516, local storage 518, physical device simulator 522, and remote resources 510 accessed through network 508.

In the illustrated embodiment, the components of photonic device simulator 522 are utilized to optimize structural parameters of the photonic device (e.g., MUX/DEMUX 114 of FIG. 1, demultiplexer 206 of FIG. 2A, multiplexer 208 of FIG. 2B, demultiplexer 316 of FIG. 3A-D, and photonic demultiplexer 400 of FIG. 4A-B). In some embodiments, system 500 may optimize the structural parameters of the photonic device via, inter alia, simulations (e.g., operational and adjoint simulations) that utilize a finite-difference time-domain (FDTD) method to model the field response (e.g., electric and magnetic fields within the photonic device). The operational simulation engine 526 provides instructions for performing an electromagnetic simulation of the photonic device operating in response to an excitation source within a simulated environment. In particular, the operational simulation determines a field response of the simulated environment (and thus the photonic device, which is described by the simulated environment) in response to the excitation source for determining a performance metric of the physical device (e.g., based off an initial description or input design of the photonic device that describes the structural parameters of the photonic device within the simulated environment with a plurality of voxels). The structural parameters may correspond, for example, to the specific design, material compositions, dimensions, and the like of the physical device. Fabrication loss calculation logic 528 provides instructions for determining a fabrication loss, which is utilized to enforce a minimum feature size to ensure fabricability. In some embodiments, the fabrication loss is also used to enforce binarization of the design (i.e., such that the photonic device includes a first material and a second material that are interspersed to form a plurality of interfaces). Calculation logic 524 computes a loss metric determined via a loss function that incorporates a performance loss, based on the performance metric, and the fabrication loss. Adjoint simulation engine 530 is utilized in conjunction with the operational simulation engine 526 to perform an adjoint simulation of the photonic device to backpropagate the loss metric through the simulated environment via the loss function to determine how changes in the structural parameters of the photonic device influence the loss metric. Optimization engine 532 is utilized to update the structural parameters of the photonic device to reduce the loss metric and generate a revised description (i.e., revising the design) of the photonic device.

Figure 6A:
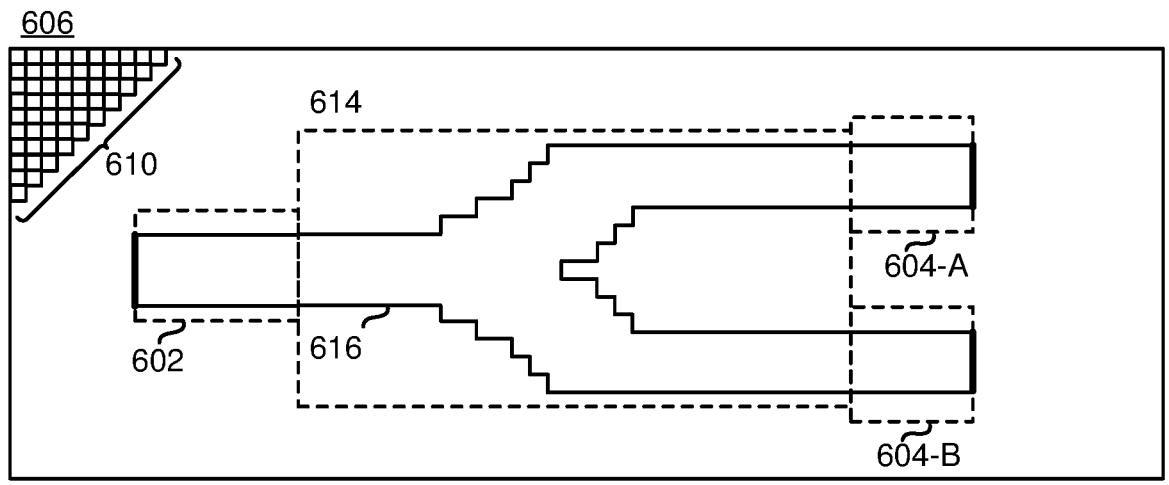
FIG. 6A illustrates a demonstrative simulated environment describing a photonic integrated circuit, in accordance with an embodiment of the present disclosure.
Figure 6B:
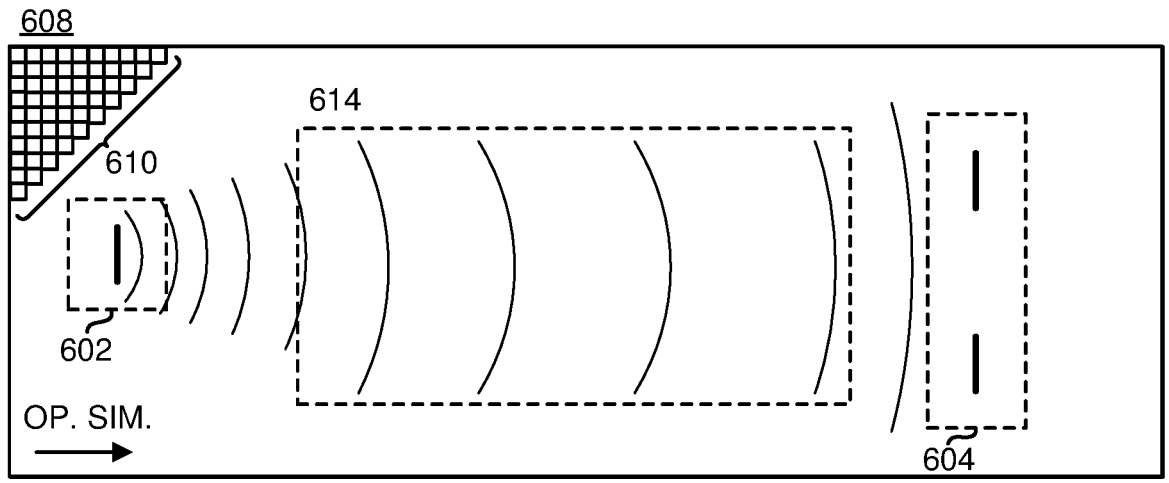
FIG. 6B illustrates an example operational simulation of a photonic integrated circuit, in accordance with an embodiment of the present disclosure.
Figure 6C:
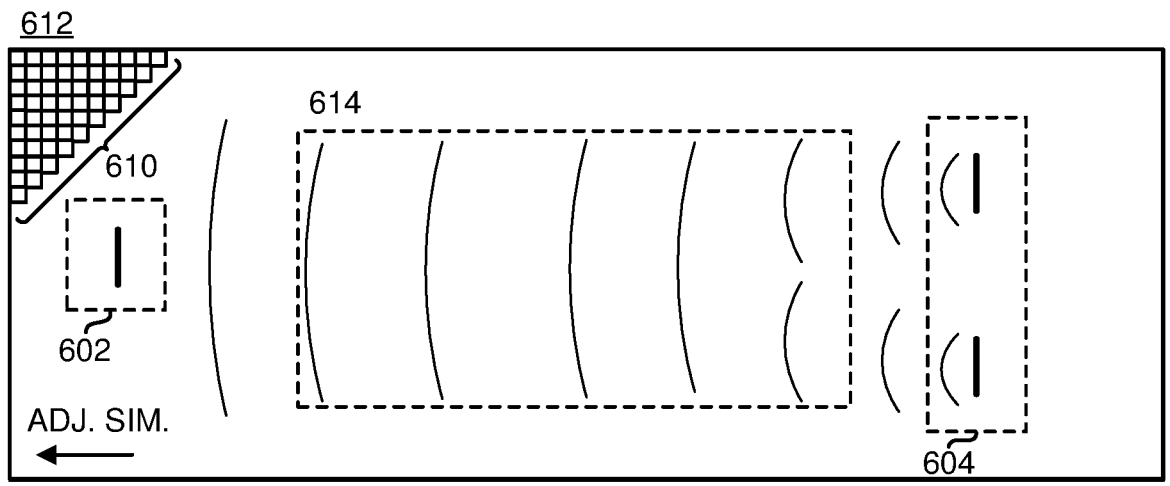
FIG. 6C illustrates an example adjoint simulation within the simulated environment by backpropagating a loss value, in accordance with an embodiment of the present disclosure.

FIGS. 6A-6C respectively illustrate an initial set up of a simulated environment describing a photonic device, performing an operational simulation of the photonic device in response to an excitation source within the simulated environment 610, and performing an adjoint simulation of the photonic device within the simulated environment 608. The initial set up of the simulated environment, 1-dimensional representation of the simulated environment, operational simulation of the physical device, and adjoint simulation of the physical device may be implemented with system 500 illustrated in FIG. 5. As illustrated in FIG. 6A-C, simulated environment is represented in two-dimensions. However, it is appreciated that other dimensionality (e.g., 3-dimensional space) may also be used to describe simulated environment and the photonic device. In some embodiments, optimization of structural parameters of the photonic device illustrated in FIG. 6A-C may be achieved via an inverse design process including, inter alia, simulations (e.g., operational simulations and adjoint simulations) that utilize a finite-difference time-domain (FDTD) method to model the field response (e.g., electric and magnetic field) to an excitation source.

FIG. 6A illustrates a demonstrative simulated environment 606 describing a photonic integrated circuit (i.e., a photonic device such as a waveguide, demultiplexer, and the like), in accordance with an embodiment of the present disclosure. More specifically, in response to receiving an initial description of a photonic device defined by one or more structural parameters (e.g., an input design), a system (e.g., system 500 of FIG. 5) configures a simulated environment 606 to be representative of the photonic device. As illustrated, the simulated environment 606 (and subsequently the photonic device) is described by a plurality of voxels 612, which represent individual elements (i.e., discretized) of the two-dimensional (or other dimensionality) space. Each of the voxels is illustrated as two-dimensional squares; however, it is appreciated that the voxels may be represented as cubes or other shapes in three-dimensional space. It is appreciated that the specific shape and dimensionality of the plurality of voxels 612 may be adjusted dependent on the simulated environment 606 and photonic device being simulated. It is further noted that only a portion of the plurality of voxels 612 are illustrated to avoid obscuring other aspects of the simulated environment 606.

Each of the plurality of voxels 612 may be associated with a structural value, a field value, and a source value. Collectively, the structural values of the simulated environment 606 describe the structural parameters of the photonic device. In one embodiment, the structural values may correspond to a relative permittivity, permeability, and/or refractive index that collectively describe structural (i.e., material) boundaries or interfaces of the photonic device (e.g., interface pattern 420 of FIG. 4B). For example, an interface 616 is representative of where relative permittivity changes within the simulated environment 606 and may define a boundary of the photonic device where a first material meets or otherwise interfaces with a second material. The field value describes the field (or loss) response that is calculated (e.g., via Maxwell's equations) in response to an excitation source described by the source value. The field response, for example, may correspond to a vector describing the electric and/or magnetic fields (e.g., in one or more orthogonal directions) at a particular time step for each of the plurality of voxels 612. Thus, the field response may be based, at least in part, on the structural parameters of the photonic device and the excitation source.

In the illustrated embodiment, the photonic device corresponds to an optical demultiplexer having a design region 614 (e.g., corresponding to dispersive region 332 of FIG. 3A, and/or dispersive region 406 of FIG. 4A), in which structural parameters of the physical device may be updated or otherwise revised. More specifically, through an inverse design process, iterative gradient-based optimization of a loss metric determined from a loss function is performed to generate a design of the photonic device that functionally causes a multi-channel optical signal to be demultiplexed and guided from input port 602 to a corresponding one of the output ports 604. Thus, input port 602 (e.g., corresponding to input region 302 of FIG. 3A, input region 402 of FIG. 4A, and the like) of the photonic device corresponds to a location of an excitation source to provide an output (e.g., a Gaussian pulse, a wave, a waveguide mode response, and the like). The output of the excitation source interacts with the photonic device based on the structural parameters (e.g., an electromagnetic wave corresponding to the excitation source may be perturbed, retransmitted, attenuated, refracted, reflected, diffracted, scattered, absorbed, dispersed, amplified, or otherwise as the wave propagates through the photonic device within simulated environment 606). In other words, the excitation source may cause the field response of the photonic device to change, which is dependent on the underlying physics governing the physical domain and the structural parameters of the photonic device. The excitation source originates or is otherwise proximate to input port 602 and is positioned to propagate (or otherwise influence the field values of the plurality of voxels) through the design region 614 towards output ports 604 of the photonic device. In the illustrated embodiment, the input port 602 and output ports 604 are positioned outside of the design region 614. In other words, in the illustrated embodiment, only a portion of the structural parameters of the photonic device is optimizable.

However, in other embodiments, the entirety of the photonic device may be placed within the design region 614 such that the structural parameters may represent any portion or the entirety of the design of the photonic device. The electric and magnetic fields within the simulated environment 606 (and subsequently the photonic device) may change (e.g., represented by field values of the individual voxels that collectively correspond to the field response of the simulated environment) in response to the excitation source. The output ports 604 of the optical demultiplexer may be used for determining a performance metric of the photonic device in response to the excitation source (e.g., power transmission from input port 602 to a specific one of the output ports 604). The initial description of the photonic device, including initial structural parameters, excitation source, performance parameters or metrics, and other parameters describing the photonic device, are received by the system (e.g., system 500 of FIG. 5) and used to configure the simulated environment 606 for performing a first-principles based simulation of the photonic device. These specific values and parameters may be defined directly by a user (e.g., of system 500 in FIG. 5), indirectly (e.g., via controller 512 culling pre-determined values stored in memory 516, local storage 518, or remote resources 510), or a combination thereof.

FIG. 6B illustrates an operational simulation of the photonic device in response to an excitation source within simulated environment 610, in accordance with various aspects of the present disclosure. In the illustrated embodiment, the photonic device is an optical demultiplexer structured to optically separate each of a plurality of distinct wavelength channels included in a multi-channel optical signal received at input port 602 and respectively guide each of the plurality of distinct wavelength channels to a corresponding one of the plurality of output ports 604. The excitation source may be selected (randomly or otherwise) from the plurality of distinct wavelength channels and originates at input port 602 having a specified spatial, phase, and/or temporal profile. The operational simulation occurs over a plurality of time steps, including the illustrated time step. When performing the operational simulation, changes to the field response (e.g., the field value) for each of the plurality of voxels 612 are incrementally updated in response to the excitation source over the plurality of time steps. The changes in the field response at a particular time step are based, at least in part, on the structural parameters, the excitation source, and the field response of the simulated environment 610 at the immediately prior time step included in the plurality of time steps. Similarly, in some embodiments the source value of the plurality of voxels 612 is updated (e.g., based on the spatial profile and/or temporal profile describing the excitation source). It is appreciated that the operational simulation is incremental and that the field values (and source values) of the simulated environment 610 are updated incrementally at each time step as time moves forward for each of the plurality of time steps during the operational simulation. It is further noted that in some embodiments, the update is an iterative process and that the update of each field and source value is based, at least in part, on the previous update of each field and source value.

Once the operational simulation reaches a steady state (e.g., changes to the field values in response to the excitation source substantially stabilize or reduce to negligible values) or otherwise concludes, one or more performance metrics may be determined. In one embodiment, the performance metric corresponds to the power transmission at a corresponding one of the output ports 604 mapped to the distinct wavelength channel being simulated by the excitation source. In other words, in some embodiments, the performance metric represents power (at one or more frequencies of interest) in the target mode shape at the specific locations of the output ports 604. A loss value or metric of the input design (e.g., the initial design and/or any refined design in which the structural parameters have been updated) based, at least in part, on the performance metric may be determined via a loss function. The loss metric, in conjunction with an adjoint simulation, may be utilized to determine a structural gradient (e.g., influence of structural parameters on loss metric) for updating or otherwise revising the structural parameters to reduce the loss metric (i.e. increase the performance metric). It is noted that the loss metric is further based on a fabrication loss value that is utilized to enforce a minimum feature size of the photonic device to promote fabricability of the device.

FIG. 6C illustrates an example adjoint simulation within simulated environment 608 by backpropagating a loss metric, in accordance with various aspects of the present disclosure. More specifically, the adjoint simulation is a time-backwards simulation in which a loss metric is treated as an excitation source that interacts with the photonic device and causes a loss response. In other words, an adjoint (or virtual source) based on the loss metric is placed at the output region (e.g., output ports 604) or other location that corresponds to a location used when determining the performance metric. The adjoint source(s) is then treated as a physical stimuli or an excitation source during the adjoint simulation. A loss response of the simulated environment 608 is computed for each of the plurality of time steps (e.g., backwards in time) in response to the adjoint source. The loss response collectively refers to loss values of the plurality of voxels that are incrementally updated in response to the adjoint source over the plurality of time steps. The change in loss response based on the loss metric may correspond to a loss gradient, which is indicative of how changes in the field response of the physical device influence the loss metric. The loss gradient and the field gradient may be combined in the appropriate way to determine a structural gradient of the photonic device/simulated environment (e.g., how changes in the structural parameters of the photonic device within the simulated environment influence the loss metric). Once the structural gradient of a particular cycle (e.g., operational and adjoint simulation) is known, the structural parameters may be updated to reduce the loss metric and generate a revised description or design of the photonic device.

In some embodiments, iterative cycles of performing the operational simulation, and adjoint simulation, determining the structural gradient, and updating the structural parameters to reduce the loss metric are performed successively as part of an inverse design process that utilizes iterative gradient-based optimization. An optimization scheme such as gradient descent may be utilized to determine specific amounts or degrees of changes to the structural parameters of the photonic device to incrementally reduce the loss metric. More specifically, after each cycle the structural parameters are updated (e.g., optimized) to reduce the loss metric. The operational simulation, adjoint simulation, and updating the structural parameters are iteratively repeated until the loss metric substantially converges or is otherwise below or within a threshold value or range such that the photonic device provides the desired performance while maintaining fabricability.

Figure 7A:
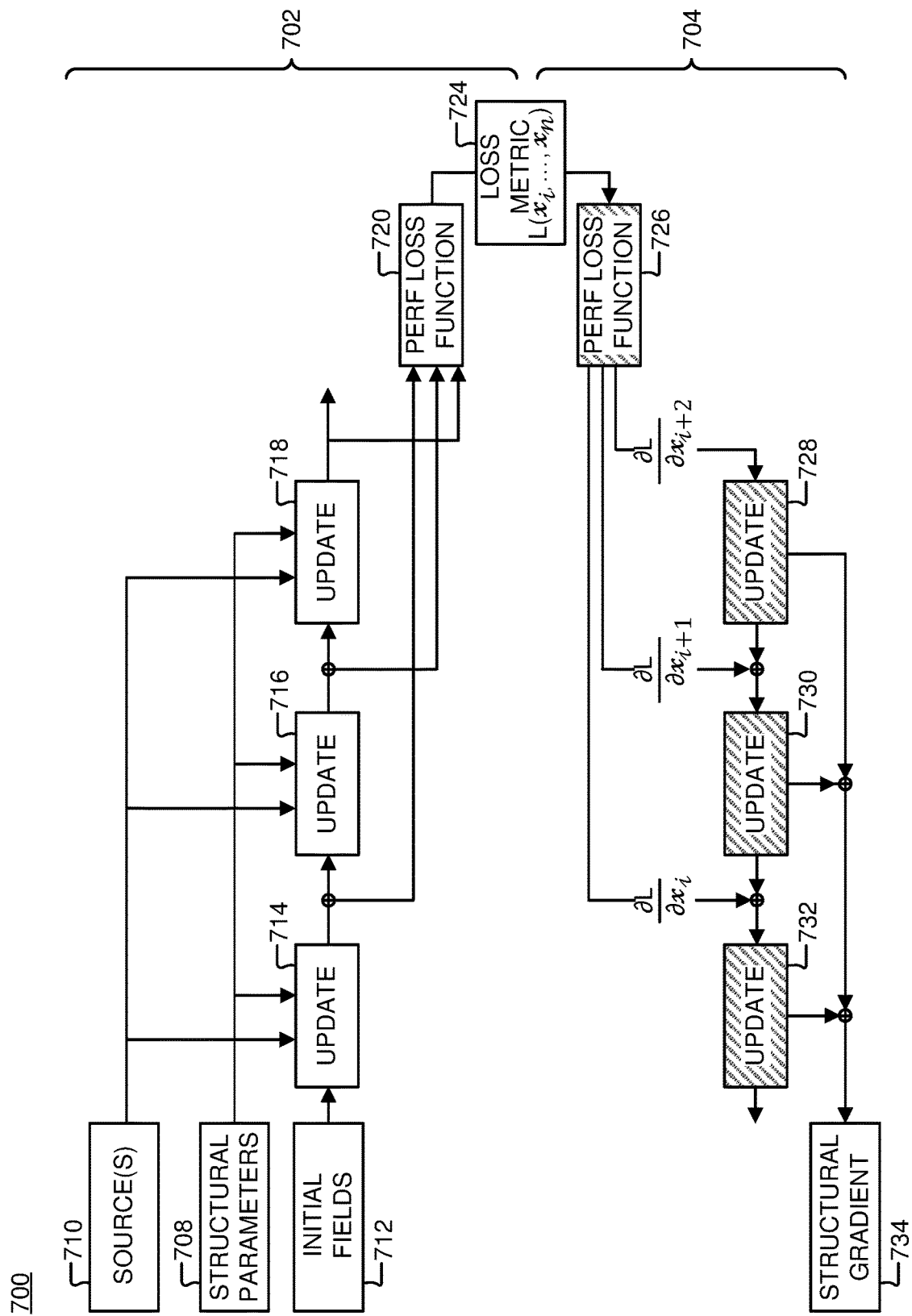
FIG. 7A is a flow chart illustrating example time steps for an operational simulation and an adjoint simulation, in accordance with various aspects of the present disclosure.

FIG. 7A is a flow chart 700 illustrating example time steps for an operational simulation 702 and an adjoint simulation 704, in accordance with various aspects of the present disclosure. Flow chart 700 is one possible implementation that a system (e.g., system 500 of FIG. 5) may use to perform the operational simulation 702 and adjoint simulation 704 of the simulated environment (e.g., simulated environment of FIG. 6A-C) describing a photonic integrated circuit (e.g., an optical device operating in an electromagnetic domain such a photonic demultiplexer). In the illustrated embodiment, the operational simulation 702 utilizes a finite-difference time-domain (FDTD) method to model the field response (both electric and magnetic) or loss response at each of a plurality of voxels (e.g., plurality of voxels 612 illustrated in FIG. 6A-C) for a plurality of time steps in response to physical stimuli corresponding to an excitation source and/or adjoint source.

As illustrated in FIG. 7A, the flow chart 700 includes update operations for a portion of operational simulation 702 and adjoint simulation 704. The operational simulation 702 occurs over a plurality of time-steps (e.g., from an initial time step to a final time step over a pre-determined or conditional number of time steps having a specified time step size) and models changes (e.g., from the initial field values 712) in electric and magnetic fields of a plurality of voxels describing the simulated environment and/or photonic device that collectively correspond to the field response. More specifically, update operations (e.g., update operation 714, update operation 716, and update operation 718) are iterative and based on the field response, structural parameters 708 (that is, for a selected one of the perturbed structural parameters 706), and one or more excitation sources 710. Each update operation is succeeded by another update operation, which are representative of successive steps forward in time within the plurality of time steps. For example, update operation 716 updates the field values 740 (see, e.g., FIG. 7B) based on the field response determined from the previous update operation 714, excitation sources 710, and the structural parameters 708. Similarly, update operation 718 updates the field values 742 (see, e.g., FIG. 7B) based on the field response determined from update operation 716. In other words, at each time step of the operational simulation the field values (and thus field response) are updated based on the previous field response and structural parameters of the photonic device.

Once the final time step of the operational simulation 702 is performed, the loss metric 724 may be determined (e.g., based on a pre-determined performance loss function 720). The loss gradients determined from block 726 may be treated as adjoint or virtual sources (e.g., physical stimuli or excitation source originating at an output region or port) which are backpropagated in reverse (from the final time step incrementally through the plurality of time steps until reaching the initial time step via update operation 728, update operation 732, and update operation 730) to determine structural gradient 734.

In the illustrated embodiment, the FDTD solve (e.g., operational simulation 702) and backward solve (e.g., adjoint simulation 704) problem are described pictorially, from a high-level, using only "update" and "loss" operations as well as their corresponding gradient operations. The simulation is set up initially in which the structural parameters, physical stimuli (i.e., excitation source), and initial field states of the simulated environment (and photonic device) are provided (e.g., via an initial description and/or input design). As discussed previously, the field values are updated in response to the excitation source based on the structural parameters. More specifically, the update operation is given by $\phi$, where $x_{i+1}=\phi(x_i,b_i,z)$ for $i=1,\ldots,n$. Here, $n$ corresponds to the total number of time steps (e.g., the plurality of time steps) for the operational simulation, where $x_i$ corresponds to the field response (the field value associated with the electric and magnetic fields of each of the plurality of voxels) of the simulated environment at time step $i$, $b_i$, corresponds to the excitation source(s) (the source value associated with the electric and magnetic fields for each of the plurality of voxels) of the simulated environment at time step $i$, and $z$ corresponds to the structural parameters describing the topology and/or material properties of the physical device (e.g., relative permittivity, index of refraction, and the like).

It is noted that using the FDTD method, the update operation may specifically be stated as:

$$\phi(x_i,b_i,z)=A(z)x_i+B(z)b_i. \quad (1)$$

That is to say the FDTD update is linear with respect to the field and source terms. Concretely, $A(z)\in\mathbb{R}^{N\times N}$ and $B(z)\in\mathbb{R}^{N\times N}$ are linear operators which depend on the structure parameters, $z$, and act on the fields, $x_i$, and the sources, $b_i$, respectively. Here, it is assumed that $x_i, b_i \in \mathbb{R}^N$ where N is the number of FDTD field components in the operational simulation. Additionally, the loss operation (e.g., loss function) may be given by $L=f(x_i,\ldots,x_n)$, which takes as input the computed fields and produces a single, real-valued scalar (e.g., the loss metric) that can be reduced and/or minimized.

In terms of revising or otherwise optimizing the structural parameters of the physical device, the relevant quantity to produce is $$\frac{dL}{dz},$$

which is used to describe the influence of changes in the structural parameters of the initial design 736 on the loss value and is denoted as the structural gradient 734 illustrated in FIG. 7A.

Figure 7B:
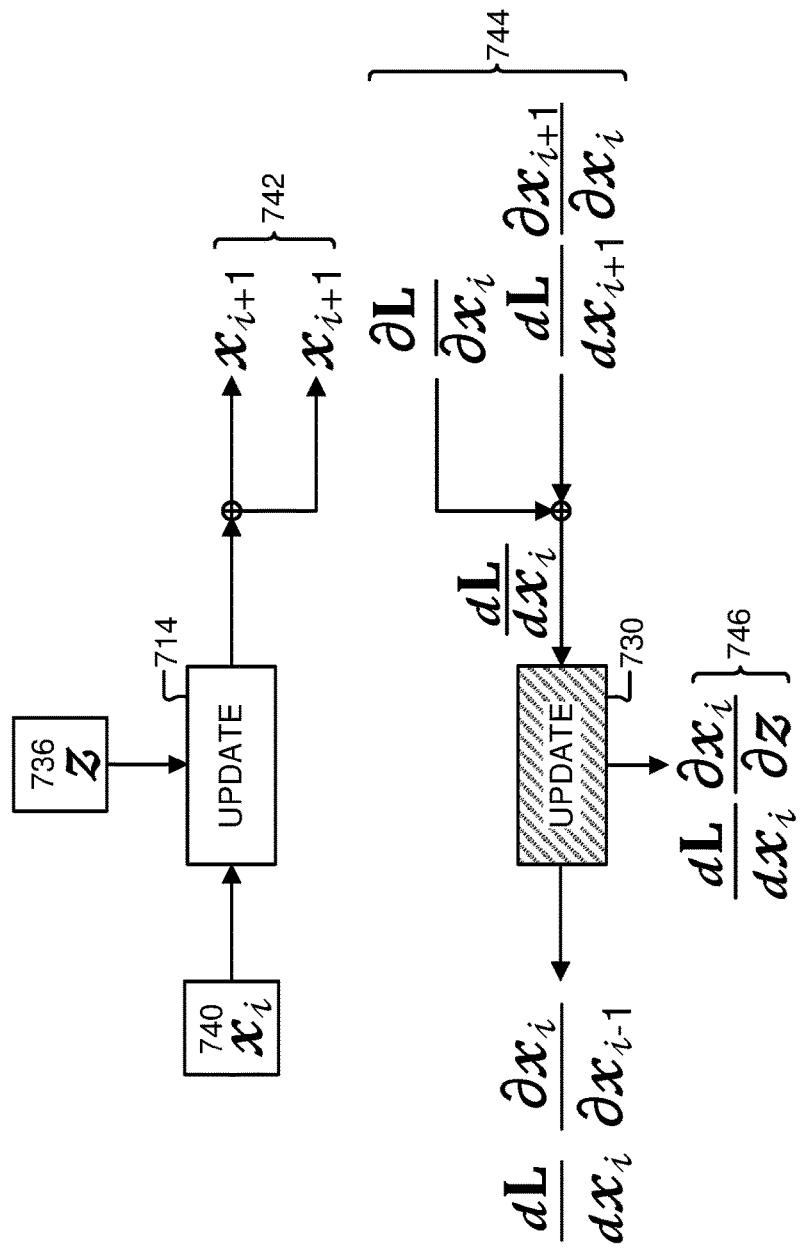
FIG. 7B is a chart illustrating the relationship between the update operation for the operational simulation and the adjoint simulation (e.g., backpropagation), in accordance with an embodiment of the present disclosure.

FIG. 7B is a chart 738 illustrating the relationship between the update operation for the operational simulation and the adjoint simulation (e.g., backpropagation), in accordance with an embodiment of the present disclosure. More specifically, FIG. 7B summarizes the operational and adjoint simulation relationships that are involved in computing the structural gradient, $$\frac{dL}{dz},$$

which include $$\frac{\partial L}{\partial x_i}, \frac{\partial x_{i+1}}{\partial x_i}, \frac{dL}{dx_i},$$

and $$\frac{\partial x_i}{\partial z}.$$

The update operation 716 of the operational simulation 702 updates the field values 740, $x_i$, of the plurality of voxels at the $z$th time step to the next time step (i.e., $z+1$ time step), which correspond to the field values 742, $x_{i+1}$. The gradients 744 are utilized to determine $$\frac{dL}{dx_i}$$

for the backpropagation (e.g., update operation 732 backwards in time), which combined with the gradients 746 are used, at least in part, to calculate the structural gradient, $$\frac{dL}{dz}. \frac{\partial L}{\partial x_i}$$

is the contribution of each field to the loss metric, L. It is noted that this is the partial derivative, and therefore does not take into account the causal relationship of $x_i \to x_{i+1}$. Thus, $$\frac{\partial x_{i+1}}{\partial x_i}$$

is utilized which encompasses the $x_i \to x_{i+1}$ relationship. The loss gradient, $$\frac{dL}{dx_i}$$

may also be used to compute the structural gradient, $$\frac{dL}{dz},$$

and corresponds to the total derivative of the field with respect to loss value, L. The loss gradient, $$\frac{dL}{dx_i},$$

at a particular time step, $z$, is equal to the summation of $$\frac{\partial L}{\partial x_i} + \frac{dL}{dx_{i+1}}\frac{\partial x_{i+1}}{\partial x_i}.$$

Finally, $$\frac{\partial x_i}{\partial z},$$

which corresponds to the field gradient, is used which is the contribution to from each time/update step.

In particular, the memory footprint to directly compute $$\frac{\partial L}{\partial x_i} \text{ and } \frac{dL}{dz}$$

is so large that it is difficult to store more than a handful of state Tensors. The state Tensor corresponds to storing the values of all of the FDTD cells (e.g., the plurality of voxels) for a single simulation time step. It is appreciated that the term "tensor" may refer to tensors in a mathematical sense or as described by the TensorFlow framework developed by Alphabet, Inc. In some embodiments the term "tensor" refers to a mathematical tensor which corresponds to a multidimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws. For example, for the general loss function $f$, it may be necessary to store the fields, $x_i$, for all time steps, $z$. This is because, for most choices of $f$, the gradient will be a function of the arguments of $f$. This difficulty is compounded by the fact that the values of $$\frac{\partial L}{\partial x_i}$$

for larger values of $z$ are needed before the values for smaller $z$ due to the incremental updates of the field response and/or through backpropagation of the loss metric, which may prevent the use of schemes that attempt to store only the values $$\frac{\partial L}{\partial x_i},$$

at an immediate time step.

An additional difficulty is further illustrated when computing the structural gradient, $$\frac{dL}{dz},$$

which is given by:

$$\frac{dL}{dz} = \sum_i \frac{\partial L}{\partial x_i} \frac{\partial x_i}{\partial z}. \quad (2)$$

For completeness, the full form of the first term in the sum, $$\frac{dL}{dz},$$

is expressed as:

$$\frac{dL}{dx_i} = \frac{\partial L}{\partial x_i} + \frac{\partial L}{\partial x_{i+1}} \frac{\partial x_{i+1}}{\partial x_i}. \quad (3)$$

Based on the definition of $\phi$ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 732), which can be expressed as:

$$\frac{dL}{dx_i} = \frac{\partial L}{\partial x_i} + \frac{dL}{dx_{i+1}} A(z), \quad (4)$$

or $$\nabla_{x_i} L = A(z)^T \nabla_{x_{i+1}} L + \frac{\partial L^T}{\partial x_i}. \quad (5)$$

The adjoint update is the backpropagation of the loss gradient (e.g., from the loss metric) from later to earlier time steps and may be referred to as a backwards solve for $$\frac{dL}{dx_i}.$$

More specifically, the loss gradient may initially be based upon the backpropagation of a loss metric determined from the operational simulation with the loss function. The second term in the sum of the structural gradient, $$\frac{dL}{dz},$$

corresponds to the field gradient and is denoted as:

$$\frac{\partial x_i}{\partial z} = \frac{d\phi(x_{i-1}, b_{i-1}, z)}{dz} = \frac{dA(z)}{dz} x_{i-1} + \frac{dB(z)}{dz} b_{i-1}, \quad (6)$$

for the particular form of $\phi$ described by equation (1). Thus, each term of the sum associated $$\frac{dL}{dz},$$

depends on both $$\frac{dL}{dx_{i_0}}.$$

for $z >= i_0$ and for $z < i_0$. Since the dependency chains of these two terms are in opposite directions, it is concluded that computing $$\frac{dL}{dz}$$

in this way requires the storage of $x_i$ values for all of $z$. In some embodiments, the need to store all field values may be mitigated by a reduced representation of the fields.

Figure 8:
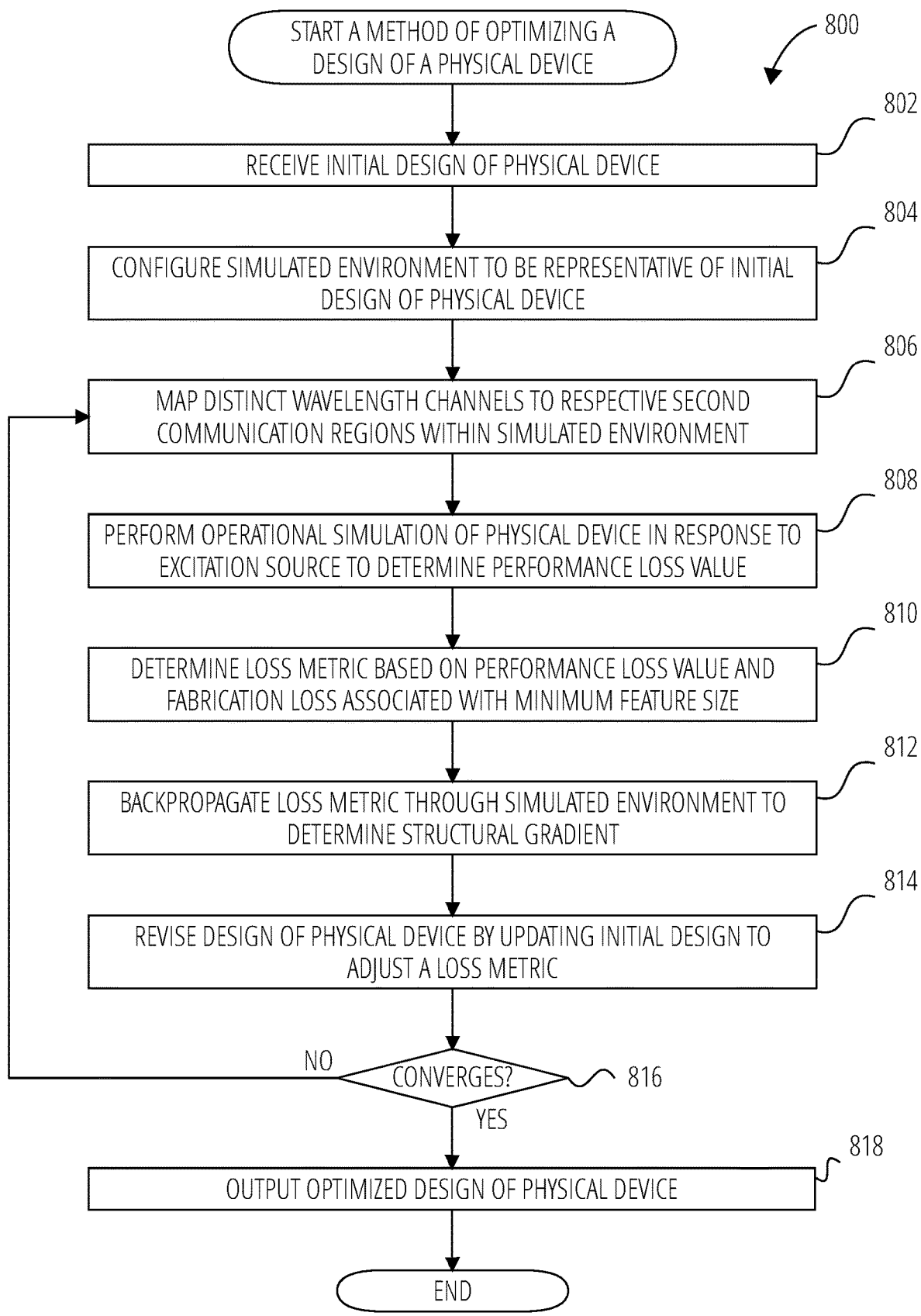
FIG. 8 is a flowchart that illustrates a non-limiting example embodiment of a method for generating a design of physical device such as a photonic integrated circuit, in accordance with various aspects of the present disclosure.

FIG. 8 is a flowchart that illustrates a non-limiting example embodiment of a method 800 for generating a design of physical device such as a photonic integrated circuit, in accordance with various aspects of the present disclosure. It is appreciated that method 800 is an inverse design process that may be accomplished by performing operations with a system (e.g., system 500 of FIG. 5) to perform iterative gradient-based optimization of a loss metric determined from a loss function that includes at least a performance loss and a fabrication loss. In the same or other embodiments, method 800 may be included as instructions provided by at least one machine-accessible storage medium (e.g., non-transitory memory) that, when executed by a machine, will cause the machine to perform operations for generating and/or improving the design of the photonic integrated circuit. It is further appreciated that the order in which some or all of the process blocks appear in method 800 should not be deemed limiting. Rather, one of ordinary skill in the art having the benefit of the present disclosure will understand that some of the process blocks may be executed in a variety of orders not illustrated, or even in parallel.

From a start block, the method 800 proceeds to block 802, where an initial design of a physical device such as a photonic integrated circuit is received. In some embodiments, the physical device may be expected to have a certain functionality (e.g., perform as an optical demultiplexer) after optimization, and the initial design provided to the method 800 may include desired performance characteristics for the output of the method 800. In some embodiments, the initial design may describe structural parameters of the physical device within a simulated environment. The simulated environment may include a plurality of voxels that collectively describe the structural parameters of the physical device. Each of the plurality of voxels is associated with a structural value to describe the structural parameters, a field value to describe the field response (e.g., the electric and magnetic fields in one or more orthogonal directions) to physical stimuli (e.g., one or more excitation sources), and a source value to describe the physical stimuli.

In some embodiments the initial design may be a first description of the physical device in which values for the structural parameters may be random values or null values outside of input and output regions such that there is no bias for the initial (e.g., first) design. It is appreciated that the initial description or input design may be a relative term. Thus, in some embodiments an initial description may be a first description of the physical device described within the context of the simulated environment (e.g., a first input design for performing a first operational simulation). However, in other embodiments, the term initial description may refer to an initial description of a particular cycle (e.g., of performing an operational simulation 702, operating an adjoint simulation 704, and updating the structural parameters). In such an embodiment, the initial design or design of that particular cycle may correspond to a revised description or refined design (e.g., generated from a previous cycle).

In some embodiments, the simulated environment includes a design region that includes a portion of the plurality of voxels which have structural parameters that may be updated, revised, or otherwise changed to optimize the structural parameters of the physical device. In the same or other embodiments, the structural parameters are associated with geometric boundaries and/or material compositions of the physical device based on the material properties (e.g., relative permittivity, index of refraction, etc.) of the simulated environment. In some embodiments, the design region may include one or more static design areas that include structural parameters that are "locked," or otherwise are not updated by the method 800. The determination and use of static design areas is described in further detail below.

At block 804, a simulated environment is configured to be representative of the initial design of the physical device (e.g., photonic device). Once the structural parameters have been received or otherwise obtained, the simulated environment is configured (e.g., the number of voxels, shape/arrangement of voxels, and specific values for the structural value, field value, and/or source value of the voxels are set based on the perturbed structural parameters).

In some embodiments the simulated environment includes a design region optically coupled between a first communication region and a plurality of second communication regions. In some embodiments, the first communication region may correspond to an input region or port (e.g., where an excitation source originates), while the second communication may correspond to a plurality of output regions or ports (e.g., when designing an optical demultiplexer that optically separates a plurality of distinct wavelength channels included in a multi-channel optical signal received at the input port and respectively guiding each of the distinct wavelength channels to a corresponding one of the plurality of output ports). However, in other embodiments, the first communication region may correspond to an output region or port, while the plurality of second communication regions corresponds to a plurality of input ports or region (e.g., when designing an optical multiplexer that optically combines a plurality of distinct wavelength signals received at respective ones of the plurality of input ports to form a multi-channel optical signal that is guided to the output port).

Block 806 shows mapping each of a plurality of distinct wavelength channels to a respective one of the plurality of second communication regions. The distinct wavelength channels may be mapped to the second communication regions by virtue of the initial design of the physical device. For example, a loss function may be chosen that associates a performance metric of the physical device with power transmission from the input port to individual output ports for mapped channels. In one embodiment, a first channel included in the plurality of distinct wavelength channels is mapped to a first output port, meaning that the performance metric of the physical device for the first channel is tied to the first output port. Similarly, other output ports may be mapped to the same or different channels included in the plurality of distinct wavelength channels such that each of the distinct wavelength channels is mapped to a respective one of the plurality of output ports (i.e., second communication regions) within the simulated environment. In one embodiment, the plurality of second communication regions includes four regions and the plurality of distinct wavelength channels includes four channels that are each mapped to a corresponding one of the four regions. In other embodiments, there may be a different number of the second communication regions (e.g., 8 regions) and a different number of channels (e.g., 8 channels) that are each mapped to a respective one of the second communication regions.

Block 808 illustrates performing an operational simulation of the physical device within the simulated environment operating in response to one or more excitation sources to determine a performance loss value. More specifically, in some embodiments an electromagnetic simulation is performed in which a field response of the photonic integrated circuit is updated incrementally over a plurality of time steps to determine how the field response of the physical device changes due to the excitation source. The field values of the plurality of voxels are updated in response to the excitation source and based, at least in part, on the structural parameters of the integrated photonic circuit. Additionally, each update operation at a particular time step may also be based, at least in part, on a previous (e.g., immediately prior) time step.

Consequently, the operational simulation simulates an interaction between the photonic device (i.e., the photonic integrated circuit) and a physical stimuli (i.e., one or more excitation sources) to determine a simulated output of the photonic device (e.g., at one or more of the output ports or regions) in response to the physical stimuli. The interaction may correspond to any one of, or combination of a perturbation, retransmission, attenuation, dispersion, refraction, reflection, diffraction, absorption, scattering, amplification, or otherwise of the physical stimuli within electromagnetic domain due, at least in part, to the structural parameters of the photonic device and underlying physics governing operation of the photonic device. Thus, the operational simulation simulates how the field response of the simulated environment changes due to the excitation source over a plurality of time steps (e.g., from an initial to final time step with a pre-determined step size).

In some embodiments, the simulated output may be utilized to determine one or more performance metrics of the physical device. For example, the excitation source may correspond to a selected one of a plurality of distinct wavelength channels that are each mapped to one of the plurality of output ports. The excitation source may originate at or be disposed proximate to the first communication region (i.e., input port) when performing the operational simulation. During the operational simulation, the field response at the output port mapped to the selected one of the plurality of distinct wavelength channels may then be utilized to determine a simulated power transmission of the photonic integrated circuit for the selected distinct wavelength channel. In other words, the operational simulation may be utilized to determine the performance metric that includes determining a simulated power transmission of the excitation source from the first communication region, through the design region, and to a respective one of the plurality of second communication regions mapped to the selected one of the plurality of distinct wavelength channels. In some embodiments, the excitation source may cover the spectrum of all of the plurality of output ports (e.g., the excitation source spans at least the targeted frequency ranges for the bandpass regions for each of the plurality of distinct wavelength channels as well as the corresponding transition band regions, and at least portions of the corresponding stopband regions) to determine a performance metric (i.e., simulated power transmission) associated with each of the distinct wavelength channels for the photonic integrated circuit. In some embodiments, one or more frequencies that span the passband of a given one of the plurality of distinct wavelength channels is selected randomly to optimize the design (e.g., batch gradient descent while having a full width of each passband including ripple in the passband that meets the target specifications). In the same or other embodiments, each of the plurality of distinct wavelength channels has a common bandwidth with different center wavelengths. The performance metric may then be used to generate a performance loss value for the set of structural parameters 708. The performance loss value may correspond to a difference between the performance metric and a target performance metric of the physical device.

Block 810 shows determining a loss metric based on the performance loss value and a fabrication loss associated with, for example, a minimum feature size. In some embodiments the loss metric is determined via a loss function that includes both the performance loss value and the fabrication loss as input values. In some embodiments, a minimum feature size for the design region of the simulated environment may be provided to promote fabricability of the design generated by the inverse design process. The fabrication loss is based, at least in part, on the minimum feature size and the perturbed structural parameters of the design region. More specifically, the fabrication loss enforces the minimum feature size for the design such that the design region does not have structural elements with a diameter less than the minimum feature size. This helps this system provide designs that meet certain fabricability and/or yield requirements. In some embodiments the fabrication loss also helps enforce binarization of the design (i.e., rather than mixing the first and second materials together to form a third material, the design includes regions of the first material and the second material that are inhomogeneously interspersed).

In some embodiments the fabrication loss is determined by generating a convolution kernel (e.g., circular, square, octagonal, or otherwise) with a width equal to the minimum feature size. The convolution kernel is then shifted through the design region of the simulated environment to determine voxel locations (i.e., individual voxels) within the design region that fit the convolution kernel within the design region without extending beyond the design region. The convolution kernel is then convolved at each of the voxel locations with the structural parameters associated with the voxel locations to determine first fabrication values. The structural parameters are then inverted and the convolution kernel is convolved again at each of the voxel locations with the inverted structural parameters to determine second fabrication values. The first and second fabrication values are subsequently combined to determine the fabrication loss for the design region. This process of determining the fabrication loss may promote structural elements of the design region having a radius of curvature less having a magnitude of less than a threshold size (i.e., inverse of half the minimum feature size).

Block 812 illustrates backpropagating the loss metric via the loss function through the simulated environment to determine an influence of changes in the structural parameters on the loss metric (i.e., structural gradient). The loss metric is treated as an adjoint or virtual source and is backpropagated incrementally from a final time step to earlier time steps in a backwards simulation to determine the structural gradient of the physical device.

Block 814 shows revising a design of the physical device (e.g., generated a revised description) by updating the structural parameters of the initial design to adjust the loss metric. In some embodiments, adjusting for the loss metric may reduce the loss metric. However, in other embodiments, the loss metric may be adjusted or otherwise compensated in a manner that does not necessarily reduce the loss metric, In one embodiment, adjusting the loss metric may maintain fabricability while providing a general direction within the parameterization space to obtain designs that will ultimately result in increased performance while also maintaining device fabricability and targeted performance metrics. In some embodiments, the revised description is generated by utilizing an optimization scheme after a cycle of operational and adjoint simulations via a gradient descent algorithm, Markov Chain Monte Carlo algorithm, or other optimization techniques. Put in another way, iterative cycles of simulating the physical device, determining a loss metric, backpropagating the loss metric, and updating the structural parameters to adjust the loss metric may be successively performed until the loss metric substantially converges such that the difference between the performance metric and the target performance metric is within a threshold range while also accounting for fabricability and binarization due to the fabrication loss. In some embodiments, the term "converges" may simply indicate the difference is within the threshold range and/or below some threshold value. As discussed in further detail below, the updates to the structural parameters may leave the structural parameters within one or more static design areas unchanged.

At decision block 816, a determination is made regarding whether the loss metric substantially converges such that the difference between the performance metric and the target performance metric is within a threshold range. Iterative cycles of simulating the physical device with the excitation source selected from the plurality of distinct wavelength channels, backpropagating the loss metric, and revising the design by updating the structural parameters to reduce the loss metric until the loss metric substantially converges such that the difference between the performance metric and the target performance metric is within a threshold range. In some embodiments, the structural parameters of the design region of the integrated photonic circuit are revised when performing the cycles to cause the design region of the photonic integrated circuit to optically separate each of the plurality of distinct wavelength channels from a multi-channel optical signal received via the first communication region and guide each of the plurality of distinct wavelength channels to the corresponding one of the plurality of second communication regions.

If the determination is that the loss metric has not converged, then the result of decision block 816 is NO, and the method 800 returns to block 806 to iterate on the revised initial design. Otherwise, if the determination is that the loss metric has converged, then the result of decision block 816 is YES and the method 800 advances to block 818.

Block 818 illustrates outputting an optimized design of the physical device in which the structural parameters have been updated to have the difference between the performance metric and the target performance metric within a threshold range while also enforcing a minimum feature size and binarization. The method 800 then proceeds to an end block and terminates. The output optimized design may be provided to a fabrication system in order to fabricate the physical device.

While the devices and techniques described above have been found to be effective, additional improvements can also be made. For example, other than fabricability constraints, the above techniques do not place any restrictions on the design of the structural parameters within the design region 614. As such, segmented designs generated for physical devices using different initial designs may have little to no similarity within the design region 614. This characteristic may have multiple drawbacks. For example, re-optimizing the entire design region 614 for every different initial design ignores the possibility of reusing optimizations for portions of the design region 614 that may work well for multiple initial designs and thus reducing the computing workload. As another example, if every physical device designed with the above techniques has a completely unique design region 614, it becomes difficult to detect counterfeiting or other infringement of the design of the physical device.

To address these drawbacks, some embodiments of the present disclosure use static design areas, in which the design of some portions of the design region 614 are predetermined and do not change during optimization. By using static design areas, multiple benefits can be obtained. For example, in some embodiments, the content of the static design area is not optimized during the inverse design process for a new physical device, and so computation costs are reduced. As another example, in some embodiments, the content of the static design area may be compared to the content of a corresponding area of an accused counterfeit device, and the counterfeiting may be established based on this reduced comparison instead of a comparison of the entire design region 614.

FIG. 9A-E are schematic illustrations of non-limiting example embodiments of physical devices that use static design areas according to various aspects of the present disclosure. FIG. 9A-9E include similar features to those illustrated in FIG. 3A. That is, the figures show a demultiplexer 916 having a width 920 and a length 922, that has a dispersive region 932 with a width 924 and a length 926 and surrounded by a periphery region 918. The demultiplexer 916 accepts input at an input region 302 at a first side 928, and the dispersive region 932 separates the input into a plurality output regions 904, including an output region 908, an output region 910, an output region 912, and an output region 914 separated by distance 906. As described above, the dispersive region 932 may be coextensive with the design region 614 illustrated in FIG. 6A-C, and may be the portion of the demultiplexer 916 that is designed via an inverse design process. As discussed above with respect to FIG. 3A, the layout of demultiplexer 916 with one input region 902 and four output regions 904 is a non-limiting example only. In some embodiments, more or fewer output regions 904 may be present, and more or fewer input regions 902 may be present. In some embodiments, the physical device may be a multiplexer, in which case the number of input regions may be greater than the number of output regions.

Figure 9A:
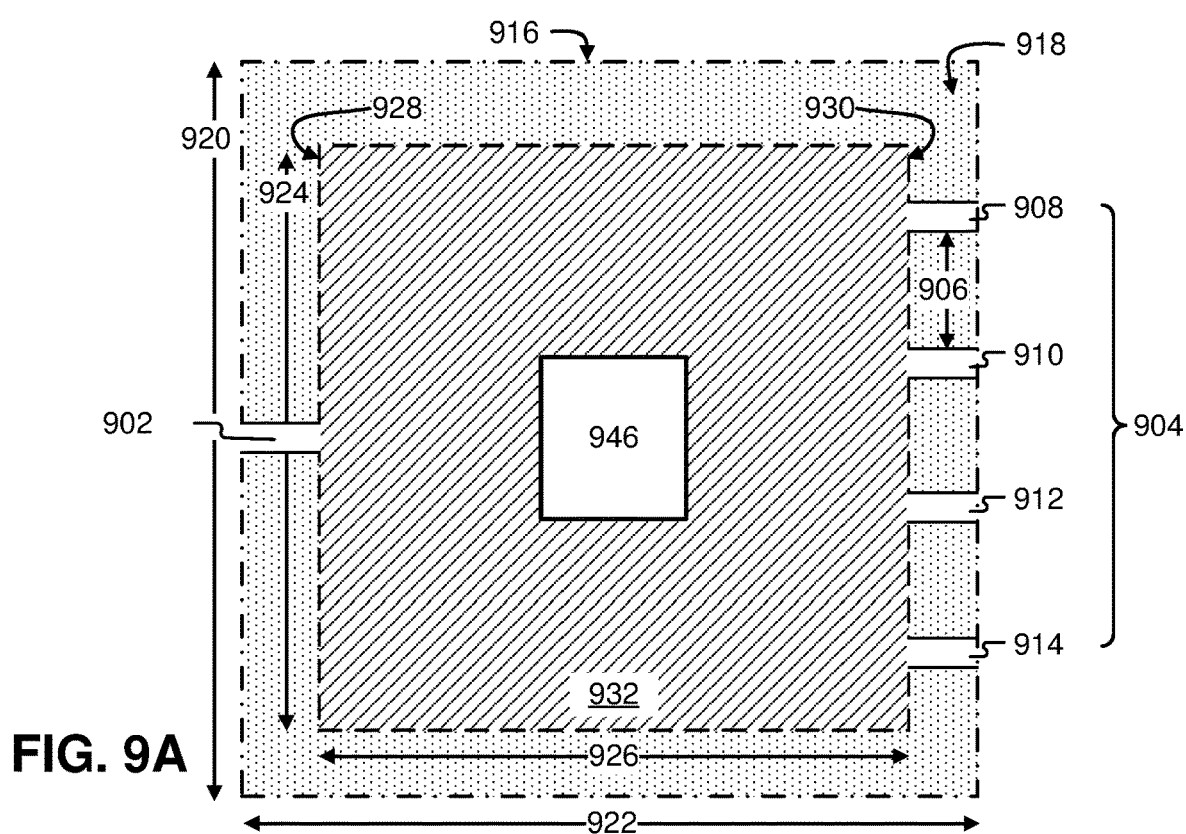
FIG. 9A-E are schematic illustrations of non-limiting example embodiments of physical devices that use static design areas according to various aspects of the present disclosure.

In FIG. 9A, a region near the input region 902 has been designated a first static design area 934, and regions near the output region 908, output region 910, output region 912, and output region 914 have been designated a second static design area 936, a third static design area 938, a fourth static design area 940, and a fifth static design area 942, respectively. In each of these static design areas, predetermined structural parameters may be provided for the dispersive region 932 within the areas, such that during the inverse design process that determines the structural parameters for the rest of the dispersive region 932 (such as the method 800 discussed above), the predetermined structural parameters within the static design areas will not change.

The size of the static design areas may be determined using any suitable technique. For example (and as discussed in further detail below), the strength of the field values in the dispersive region 932 may be determined during the inverse design process, and one or more regions that have strong field values may be selected. Regions having strong field values are expected to have a strong effect on the overall performance of the demultiplexer 916. Accordingly, in such embodiments, the static design areas may have a greater effect on the design of the remainder of the dispersive region 932. This makes it more difficult to create a counterfeit version of the remainder of the dispersive region 932 without exactly copying the contents of the static design areas.

If such techniques are used to determine the size of the static design areas, then differently sized static design areas may result depending on the particular designs used to determine the static design areas. For example, the first static design area 934, second static design area 936, third static design area 938, fourth static design area 940, and fifth static design area 942 of FIG. 9A are larger than the corresponding static design areas of FIG. 9B. This may be due to smaller areas within the dispersive region 932 of FIG. 9B having strong enough field values to be included, or may be due to a higher threshold being used for the field values to be included in the static design areas.

Figure 9B:
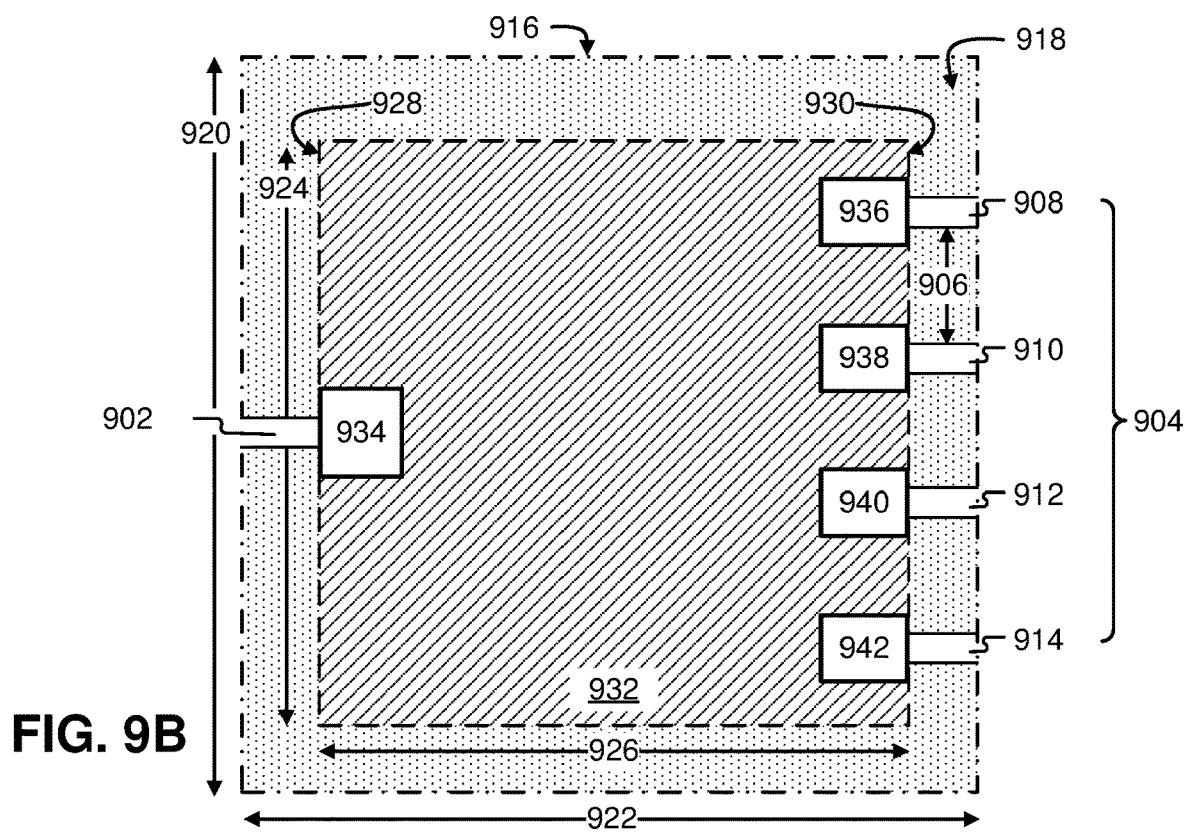
Figure 9C:
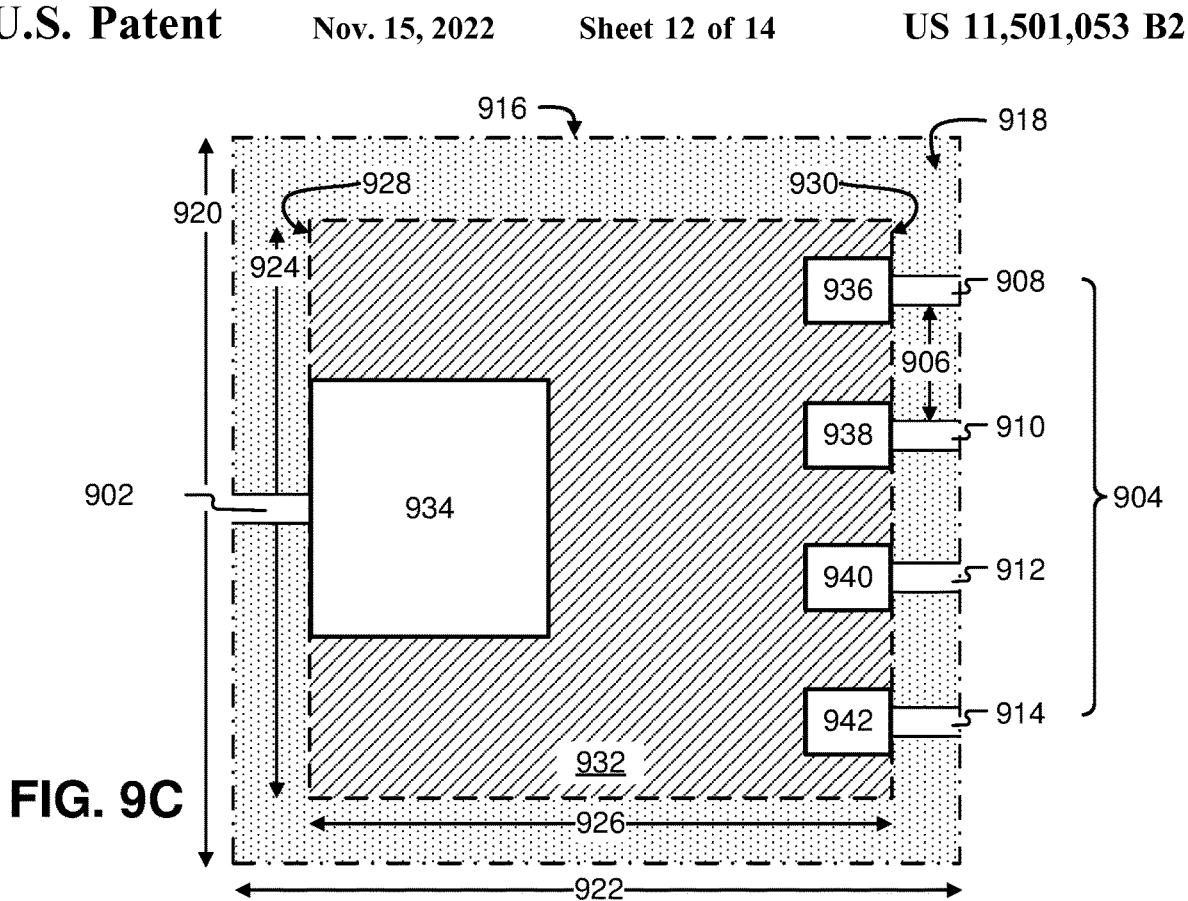

FIG. 9A and FIG. 9B illustrate static design areas that are approximately equal in size. However, this is merely a non-limiting example. FIG. 9C illustrates an example wherein the first static design area 934 is relatively large, and the second static design area 936, third static design area 938, fourth static design area 940, and fifth static design area 942 are relatively small. Because the sizes may be determined based on the field values, the differences in sizes may reflect the differences in the field values throughout the dispersive region 932.

Figure 9D:
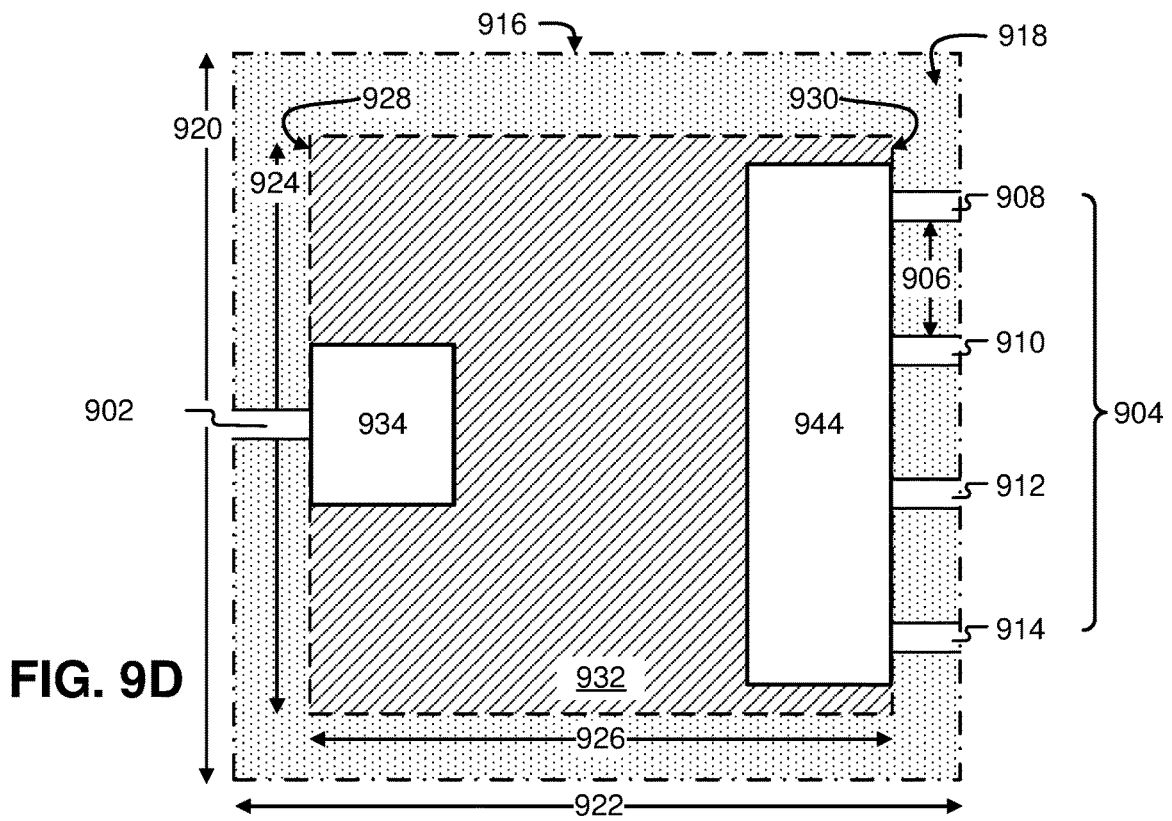

FIG. 9A-C illustrate example embodiments wherein the input region 902 and each of the output regions 904 has a single associated static design area. This may occur due to a design decision (e.g., areas with high field values near an input region or an output region may be selected), or may occur due to the natural design process. FIG. 9D illustrates another example embodiment, wherein instead of separate static design areas associated with each of the output regions 904, a single sixth static design area 944 is positioned at the second side 930 of the dispersive region 932 and is associated with all of the output regions 904. Again, this may occur due to a design decision, or may occur due to the natural design process.

Figure 9E:
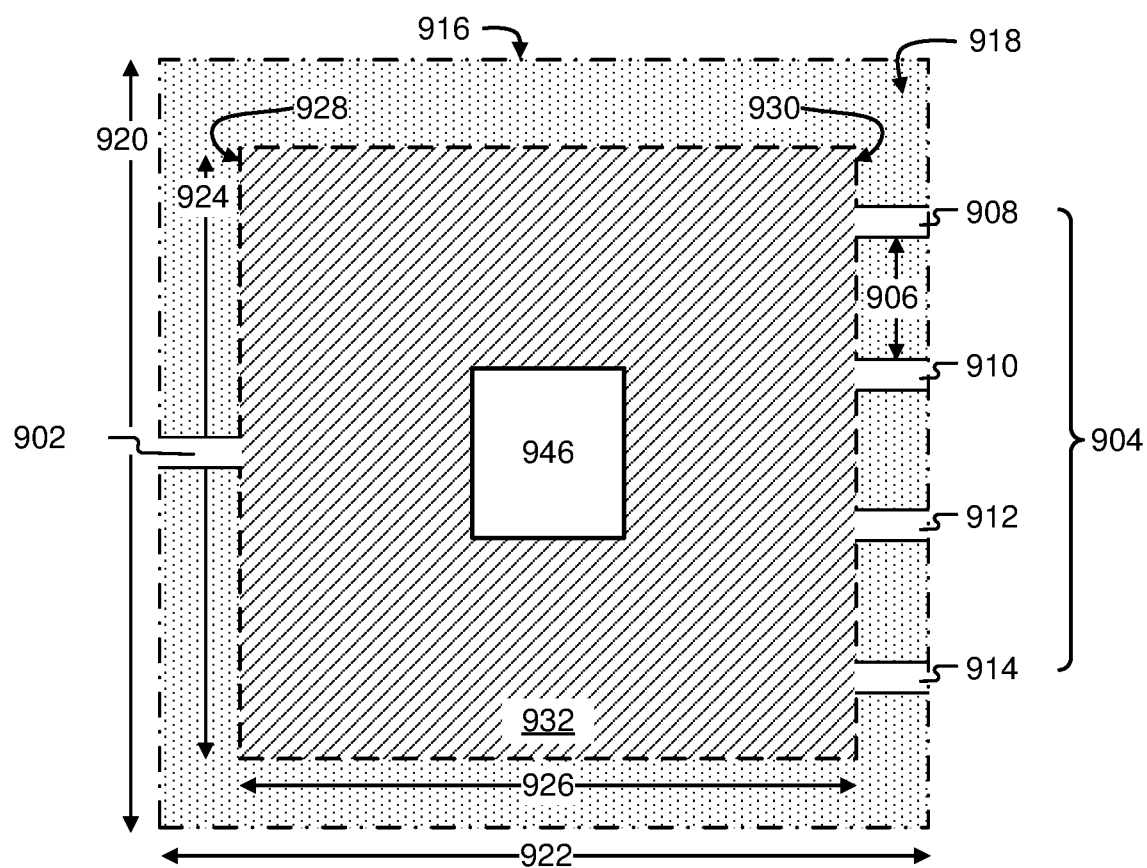

FIG. 9A-D each illustrate example embodiments wherein the static design areas are associated with the first side 928 or the second side 930. In other embodiments, one or more static design areas may be located in other positions. FIG. 9E illustrates a seventh static design area 946 that is not positioned close to the input region 902 or any of the output regions 904. Such an embodiment may occur if the field values for the central portion of the dispersive region 932 are particularly high.

Figure 10:
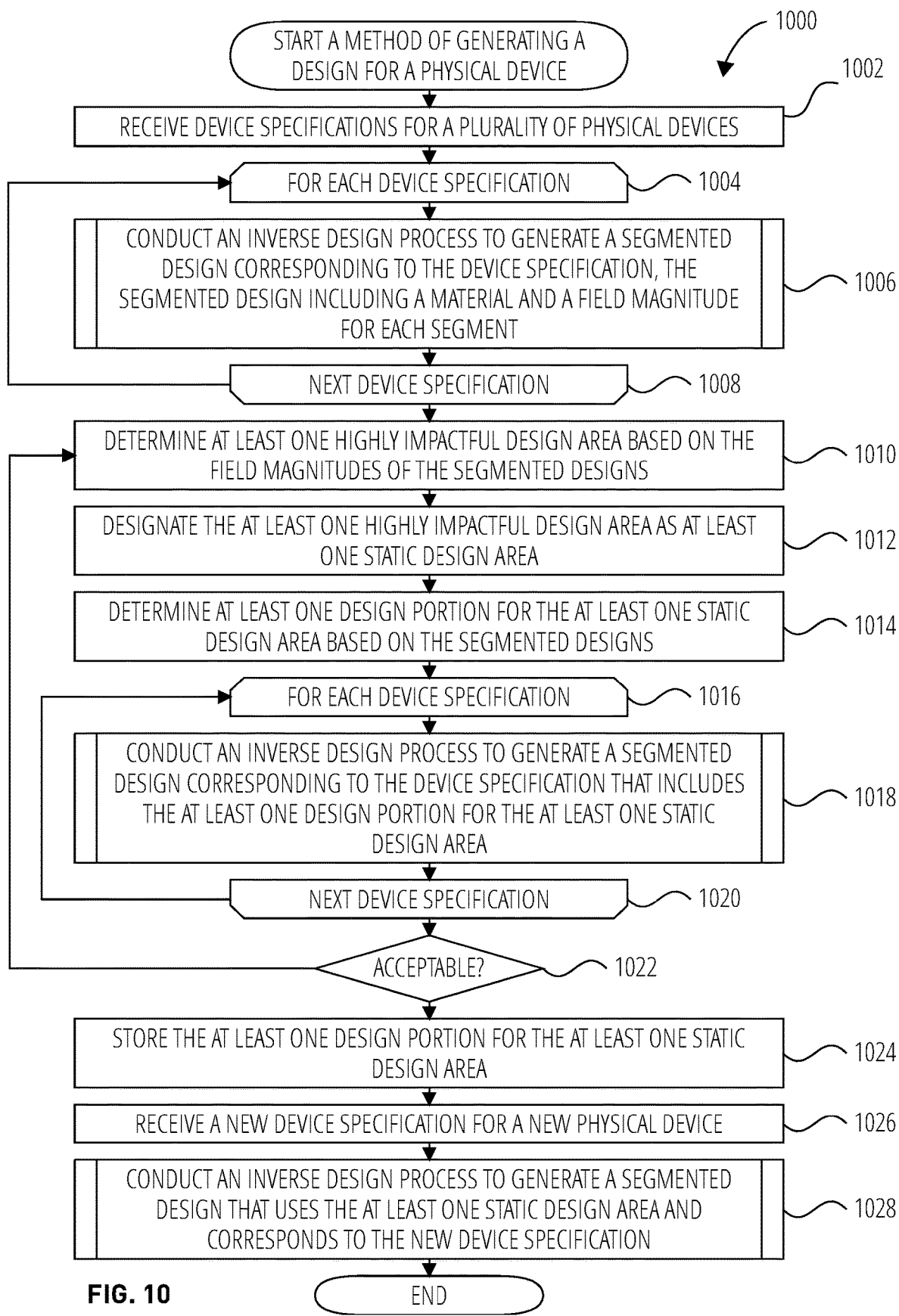
FIG. 10 is a flowchart that illustrates a non-limiting example embodiment of a method of generating a design for a physical device according to various aspects of the present disclosure.

FIG. 10 is a flowchart that illustrates a non-limiting example embodiment of a method of generating a design for a physical device according to various aspects of the present disclosure. In the method 1000, appropriate areas for one or more static design areas are determined, as well as contents for the static design areas. Those static design areas are then used within generated designs for a plurality of physical devices, such that all of the generated designs will share a common design within the static design areas.

From a start block, the method 1000 proceeds to block 1002, where device specifications for a plurality of physical devices are received. The device specifications may be similar to the initial design described in method 800 above, in that the device specifications may include desired performance characteristics for the physical devices, may include initial structural parameters for the physical devices, or may specify a desired outcome for the design of the physical devices in any other suitable way. In some embodiments, the device specifications may each describe physical devices with some similar characteristics, such as matching dimensions, a matching number of input ports and/or a matching number of output ports, and some dissimilar characteristics, such as desired wavelength gain properties. Using device specifications that have some similar characteristics may lead to more effective static design areas due to the similarities in the actions to be performed by the physical devices. In some embodiments, device specifications that do not share matching numbers of input ports or output ports may be used.

The method 1000 then proceeds to a for-loop defined between a for-loop start block 1004 and a for-loop end block 1008, wherein each device specification is processed. From the for-loop start block 1004, the method 1000 advances to subroutine block 1006, where an inverse design process is conducted to generate a segmented design corresponding to the device specification, the segmented design including a material (e.g., structural parameters) and a field magnitude for each segment in the segmented design. The method 800 discussed above is one non-limiting example of an inverse design process that may be used at subroutine block 1006 to generate the segmented design based on the device specification, though in some embodiments, other techniques may be used.

The method 1000 then proceeds to for-loop end block 1008. If further device specifications remain to be processed, then the method 1000 loops back to for-loop start block 1004 to process the next device specification. Otherwise, if all of the device specifications have been processed, then the method 1000 proceeds to block 1010.

At this point, the method 1000 has determined a plurality of segmented designs based on the plurality of device specifications. At block 1010, at least one highly impactful design area is determined based on the field magnitudes of the segmented designs. One purpose of determining at least one highly impactful design area is to find portions of the segmented designs that, if changed, would greatly change the overall performance of the segmented designs. The method 1000 may consider all of the segmented designs in order to find areas that are in general found to be highly impactful across the segmented designs.

In some embodiments, the method 1000 may analyze field magnitudes in corresponding regions of the segmented designs. For example, the method 1000 may determine average field magnitudes in corresponding segments of the segmented designs, and may find the highly impactful design areas by selecting regions wherein the average field magnitudes are greater than a predetermined threshold, or are otherwise high when compared to average field magnitudes of other regions.

In some embodiments, the method 1000 may consider field magnitudes within the entire design region 614. In some embodiments, the method 1000 may consider field magnitudes in predetermined regions, such as regions near an input port or an output port. The method 1000 may start by specifying an initial region for a highly impactful design area (such as a region near an input port or an output port), and may thereafter increase a size, decrease a size, or change a shape of the region based on the average field values.

At block 1012, the at least one highly impactful design area is designated as at least one static design area. The description herein describes a separate determination of a highly impactful design area and a designation of a static design area for the sake of clarity in describing the various actions. In some embodiments, the actions of block 1012 may be combined with the actions of block 1010, and the method 1000 may directly designate the static design area without first separately determining the highly impactful design area.

At this point in the method 1000, even though a static design area has been designated, each segmented design still likely includes different segments within the static design area. Accordingly, at block 1014, at least one design portion is determined for the at least one static design area based on the segmented designs. Each design portion specifies structural parameters for the segments within each static design area, respectively. The design portions may be determined using any suitable technique. Typically, the design portions may be determined by determining a segmented design having a desired performance characteristic, and using the portion of the determined segmented design as the design portion for the static design area. Any desired performance characteristic may be used, including but not limited to having a maximum overall performance with respect to a corresponding device specification and having maximum field magnitudes within the highly impactful design area. In some embodiments, if more than one static design area is present, segmented designs may be determined separately for each static design area. In some embodiments, if more than one static design area is present, a single segmented design may be determined, and design portions from the single segmented design may be used for each of the static design areas.

The method 1000 then proceeds to a for-loop defined between a for-loop start block 1016 and a for-loop end block 1020, where each of the device specifications is again processed. In some embodiments, the for-loop may skip processing the device specification associated with the segmented design that was determined for use as the design portion for the static design area, if the same segmented design was used for all of the static design areas.

From the for-loop start block 1016, the method 1000 proceeds to subroutine block 1018, where an inverse design process is conducted to generate a segmented design corresponding to the device specification that includes the at least one design portion for the at least one static design area. In some embodiments, the method 800 described above is used at subroutine block 1018. In the method 800, the design portions for the at least one static design area are provided as part of the initial design, and at block 814, the structural parameters for the segments within the at least one static design area are not updated.

The method 1000 then proceeds to for-loop end block 1020. If further device specifications remain to be processed, then the method 1000 loops back to for-loop start block 1016 to process the next device specification. Otherwise, if all of the device specifications have been processed, then the method 1000 proceeds to decision block 1022.

At decision block 1022, a determination is made regarding whether the performance of the newly generated segmented designs is acceptable. In some embodiments, the performance of the newly generated segmented designs may be acceptable if all of the newly generated segmented designs were able to be successfully generated by subroutine block 1018, and if all of the newly generated segmented designs have a calculated performance that is within a predetermined threshold value of a desired performance specified in its corresponding device specification.

If it is determined that the performance of the newly generated segmented designs is not acceptable, then the result of decision block 1022 is NO, and the method 1000 returns to block 1010. In some embodiments, after returning to block 1010, a different at least one highly impactful design area may be chosen in order to increase the chances that performance of the generated segmented designs is acceptable. For example, the size of the highly impactful design area may be reduced, thus leaving a larger area to be optimized by the inverse design process. In some embodiments, the at least one highly impactful design area chosen at block 1010 may be the same, but the at least one design portion determined at block 1014 may be different.

At decision block 1022, if it is determined that the performance of the newly generated segmented designs is acceptable, then the result of decision block 1022 is YES, and the method 1000 advances to block 1024, where the at least one design portion for the at least one static design area is stored for later use. In some embodiments, one or more of the generated segmented designs may also be stored for later use and/or transmitted to a fabrication system for fabrication.

At block 1026, a new device specification for a new physical device is received. The new device specification is similar in content to the device specifications received at block 1002, but is new in the sense that it was not included in the device specifications received at block 1002.

At subroutine block 1028, an inverse design process is conducted to generate a segmented design that uses the at least one static design area and corresponds to the new device specification. Again, the subroutine block 1028 may use the method 800 described above to generate the segmented design for the new device specification, with the design portions for the at least one static design area provided as part of the initial design, and without updating the structural parameters for the segments within the at least one static design area in block 814. Once subroutine block 1028 is complete, the segmented design for the new physical device may be transmitted to a fabrication system for fabrication.

The method 1000 then proceeds to an end block and terminates.

In the preceding description, numerous specific details are set forth to provide a thorough understanding of various embodiments of the present disclosure. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The order in which some or all of the blocks appear in each method flowchart should not be deemed limiting.

Rather, one of ordinary skill in the art having the benefit of the present disclosure will understand that actions associated with some of the blocks may be executed in a variety of orders not illustrated, or even in parallel.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A non-transitory computer-readable medium having logic stored thereon that, in response to execution by one or more processors of a computing system, causes the computing system to perform actions comprising:
   conducting an inverse design process to generate a plurality of segmented designs corresponding to a plurality of device specifications, wherein each segmented design includes a design region comprising structures optimized based on a corresponding device specification during the inverse design process;
   determining at least one highly impactful design area based on the plurality of segmented designs, wherein the at least one highly impactful design area is a subarea of the design region, and wherein the determining includes:
      analyzing field magnitudes in corresponding regions of the plurality of segmented designs; and
      selecting at least one region wherein an average field magnitude is greater than a threshold field magnitude; and
   designating the at least one highly impactful design area as a static design area.

2. The non-transitory computer-readable medium of claim 1, wherein the corresponding regions of the plurality of segmented designs include at least one region within the design region near at least one input port and at least one region within the design region near at least one output port.

3. The non-transitory computer-readable medium of claim 2, wherein determining the at least one highly impactful design area based on the plurality of segmented designs includes increasing or decreasing a size of the at least one region within the design region near at least one input port or the at least one region within the design region near at least one output port based on the field magnitudes.

4. The non-transitory computer-readable medium of claim 1, wherein the actions further comprise determining structures to be used in the static design area based on the plurality of segmented designs.

5. The non-transitory computer-readable medium of claim 4, wherein determining the structures to be used in the static design area based on the plurality of segmented designs includes:
   determining a segmented design of the plurality of segmented designs having a desired performance characteristic; and
   using structures of the determined segmented design within the static design area as the structures to be used in the static design area.

6. The non-transitory computer-readable medium of claim 5, wherein determining the segmented design of the plurality of segmented designs having the desired performance characteristic includes determining the segmented design of the plurality of segmented designs having maximum field magnitudes within the highly impactful design area.

7. The non-transitory computer-readable medium of claim 5, wherein determining the segmented design of the plurality of segmented designs having the desired performance characteristic includes determining the segmented design of the plurality of segmented designs having maximum performance with respect to its corresponding device specification.

8. The non-transitory computer-readable medium of claim 4, wherein the actions further comprise:
   repeating the inverse design process for the plurality of device specifications while using the determined structures for the static design area to generate a plurality of updated segmented designs.

9. The non-transitory computer-readable medium of claim 8, wherein the actions further comprise:
   verifying performance characteristics of the plurality of updated segmented designs; and
   in response to determining at least one updated segmented design cannot achieve a desired performance characteristic, determining different structures to be used in the static design area.

10. The non-transitory computer-readable medium of claim 4, wherein the actions further comprise:
    receiving a new device specification for a new device; and
    conducting an inverse design process to generate a new segmented design corresponding to the new device specification, wherein the new segmented design uses the determined structures for the static design area.

11. A computer-implemented method for inverse design of a physical device, the method comprising:
    receiving a device specification;
    determining structures for use in a static design area within a design region, wherein the design region connects one or more input ports and one or more output ports; and
    conducting an inverse design process to generate a segmented design corresponding to the device specification, wherein the inverse design process optimizes structures within the design region other than the determined structures in the static design area.

12. The computer-implemented method of claim 11, wherein determining the structures for use in the static design area within the design region includes retrieving the design portion from a computer-readable medium.

13. The computer-implemented method of claim 11, wherein determining the structures for use in the static design area includes:
    conducting an inverse design process to generate a plurality of segmented designs corresponding to a plurality of device specifications, wherein each segmented design includes a design region comprising structures optimized based on a corresponding device specification during the inverse design process;

determining at least one highly impactful design area based on the plurality of segmented designs, wherein the at least one highly impactful design area is a subarea of the design region; and designating the at least one highly impactful design area as a static design area.

14. The computer-implemented method of claim 13, wherein determining the at least one highly impactful design area based on the plurality of segmented designs includes:

analyzing field magnitudes in corresponding regions of the plurality of segmented designs; and selecting at least one region wherein an average field magnitude is greater than a threshold field magnitude.

15. The computer-implemented method of claim 14, wherein the corresponding regions of the plurality of segmented designs include at least one region within the design region near at least one input port and at least one region within the design region near at least one output port.

16. The computer-implemented method of claim 15, wherein determining the at least one highly impactful design area based on the plurality of segmented designs includes increasing or decreasing a size of the at least one region within the design region near at least one input port or the at least one region within the design region near at least one output port based on the field magnitudes.

17. The computer-implemented method of claim 13, wherein determining the design portion for use in the static design area further includes determining structures to be used in the static design area based on the plurality of segmented designs.

18. The computer-implemented method of claim 17, wherein determining the structures to be used in the static design area based on the plurality of segmented designs includes:

determining a segmented design of the plurality of segmented designs having a desired performance characteristic; and using structures of the determined segmented design within the static design area as the structures to be used in the static design area.

19. A product line comprising a plurality of physical devices;

wherein each physical device of the plurality of physical devices includes a design region, wherein the design region connects one or more input ports and one or more output ports;

wherein the design region of each physical device includes a static design area and a customized design area;

wherein structures within the static design area for each physical device are specified by a segmented design determined by an inverse design process, and wherein the segmented design for the structures within the static design area is the same for each physical device of the plurality of physical devices; and wherein structures within the customized design area for each physical device are specified by a segmented design determined by an inverse design process, and wherein the segmented design for the structures within the customized design area is different for each physical device of the plurality of physical devices.

* * * * *